United States Patent
Ito

(10) Patent No.: US 10,771,013 B2
(45) Date of Patent: Sep. 8, 2020

(54) OSCILLATOR, ELECTRONIC APPARATUS, VEHICLE, AND MANUFACTURING METHOD OF OSCILLATOR

(71) Applicant: SEIKO EPSON CORPORATION, Tokyo (JP)

(72) Inventor: Hisahiro Ito, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/902,476

(22) Filed: Feb. 22, 2018

(65) Prior Publication Data

US 2018/0248517 A1    Aug. 30, 2018

(30) Foreign Application Priority Data

Feb. 28, 2017  (JP) .................... 2017-036454

(51) Int. Cl.
| | |
|---|---|
| *G06F 5/06* | (2006.01) |
| *H03K 3/354* | (2006.01) |
| *H03B 5/36* | (2006.01) |
| *H01L 41/053* | (2006.01) |
| *H03H 9/25* | (2006.01) |
| *H03H 9/10* | (2006.01) |
| *H03H 9/05* | (2006.01) |

(52) U.S. Cl.
CPC ........... *H03B 5/364* (2013.01); *H01L 41/053* (2013.01); *H03B 5/362* (2013.01); *H03B 5/366* (2013.01); *H03H 9/25* (2013.01); *H03B 2200/0038* (2013.01); *H03B 2201/0208* (2013.01); *H03B 2201/0266* (2013.01); *H03H 9/0547* (2013.01); *H03H 9/1021* (2013.01)

(58) Field of Classification Search
CPC ........ H03B 5/364; H03B 5/366; H03B 5/362; H03B 2201/0266; H03B 2201/0208; H03B 2200/0038; H03H 9/25; H03H 9/1021; H03H 9/0547; H01L 41/053
USPC .......................... 331/73, 116 R, 116 FE, 158
See application file for complete search history.

(56) References Cited

U.S. PATENT DOCUMENTS

| | | | |
|---|---|---|---|
| 4,956,618 A | 9/1990 | Ulmer | |
| 5,923,222 A | 7/1999 | Russell et al. | |
| 6,118,348 A | 9/2000 | Narahara | |
| 7,030,709 B2 | 4/2006 | Novac | |
| 7,109,810 B2 * | 9/2006 | Senthilkumar | ........ H03B 5/368 331/116 R |
| 2004/0090279 A1 | 5/2004 | Seki | |
| 2009/0121799 A1 * | 5/2009 | Ishikawa | ................ H03B 5/366 331/116 R |

(Continued)

FOREIGN PATENT DOCUMENTS

| | | |
|---|---|---|
| JP | 2004-085324 A | 3/2004 |
| JP | 2010-011254 A | 1/2010 |

(Continued)

*Primary Examiner* — Richard Tan
(74) *Attorney, Agent, or Firm* — Oliff PLC

(57) ABSTRACT

An oscillator includes: an external terminal, a resonator, and an oscillation circuit that oscillates the resonator, in which the oscillation circuit includes an amplification circuit and a current source which supplies a current to the amplification circuit, in which the current is set according to a first control signal which is input from the external terminal and a drive level of the resonator is changed according to the setting of the current.

20 Claims, 15 Drawing Sheets

(56) References Cited

U.S. PATENT DOCUMENTS

| | | | |
|---|---|---|---|
| 2009/0261914 A1 | 10/2009 | Kao et al. | |
| 2010/0188156 A1* | 7/2010 | Arai | H03B 5/366 331/15 |
| 2014/0210565 A1 | 7/2014 | Vitas Boas et al. | |
| 2015/0056934 A1* | 2/2015 | Griffith | H03L 7/02 455/84 |
| 2015/0116043 A1 | 4/2015 | Itasaka et al. | |
| 2015/0116048 A1* | 4/2015 | Yamamoto | H03B 5/362 331/116 FE |
| 2016/0181978 A1 | 6/2016 | Mittal et al. | |
| 2017/0288680 A1 | 10/2017 | Feng et al. | |
| 2017/0346442 A1* | 11/2017 | Ito | H03B 5/326 |
| 2018/0109264 A1 | 4/2018 | Kim | |

FOREIGN PATENT DOCUMENTS

| | | |
|---|---|---|
| JP | 2010-246059 A | 10/2010 |
| JP | 2015-088924 A | 5/2015 |

* cited by examiner

OSCILLATOR, ELECTRONIC APPARATUS, VEHICLE, AND MANUFACTURING METHOD OF OSCILLATOR

BACKGROUND

1. Technical Field

The present invention relates to an oscillator, an electronic apparatus, a vehicle, and a manufacturing method of an oscillator.

2. Related Art

An oscillator that outputs a signal with a desired frequency by oscillating a resonator such as a quartz crystal resonator, is widely used in various electronic apparatuses and systems. In this type of oscillator, an inspection for selecting a good product and a defective product is performed before shipment. For example, JP-A-2010-246059 discloses a technique of monitoring an oscillation output while changing a negative resistance value of an IC circuit by using a quartz crystal oscillator including a unit which changes the negative resistance value of the IC circuit according to a control signal from the outside, obtaining a series resonance resistance value of a quartz crystal resonator from the negative resistance value at a time of oscillation stop and/or oscillation start, and determining whether the quartz crystal resonator is good or defective based on a relationship between the series resonance resistance value and the negative resistance value which is set when the IC circuit is designed.

However, even when the series resonance resistance value of the quartz crystal resonator is normal, in some cases, a frequency of the oscillator becomes abnormal due to a foreign matter attached to the quartz crystal resonator. In this case, the inspection described in JP-A-2010-246059 is not sufficient as an inspection of the quartz crystal resonator. In order to determine whether a foreign matter is attached to the quartz crystal resonator, an inspection of a drive level dependency (DLD) of the quartz crystal resonator with respect to the oscillation frequency (hereinafter, referred to as "DLD inspection") is performed. However, in order to perform the DLD inspection, it is necessary to provide inspection terminals electrically connected to both ends of the resonator in the oscillator. As a result, in a small-packaged oscillator, there is a problem in that it is difficult to secure a space for providing the inspection terminals and to probe the inspection terminals by a measurement device. Further, since the terminals for probing are exposed to the outside of the oscillator, a risk of breakdown of the oscillation circuit due to input of static electricity via the terminals may also increase.

SUMMARY

An advantage of some aspects of the invention is to provide an oscillator and a manufacturing method of an oscillator capable of realizing downsizing and a reduction of a risk of breakdown due to static electricity and capable of inspecting a drive level dependency of the resonator. Another advantage of some aspects of the invention is to provide an electronic apparatus using the oscillator and a vehicle using the oscillator.

The invention can be implemented as the following forms or application examples.

APPLICATION EXAMPLE 1

An oscillator according to this application example includes: an external terminal; a resonator; and an oscillation circuit that oscillates the resonator, in which the oscillation circuit includes an amplification circuit and a current source which supplies a current to the amplification circuit, and in which the current is set according to a first control signal which is input from the external terminal and a drive level of the resonator is changed according to the setting of the current.

According to the oscillator of this application example, the drive level of the resonator is changed according to the current which is variably set by the first control signal input from the external terminal, and thus it is possible to inspect the drive level dependency of the resonator based on the output signal of the oscillator.

In addition, according to the oscillator of this application example, the oscillator is not provided with inspection terminals electrically connected to both ends of the resonator, and thus it is possible to realize downsizing of the oscillator and a reduction of a risk of breakdown due to static electricity.

APPLICATION EXAMPLE 2

In the oscillator according to the application example, the amplification circuit may include an NMOS transistor and a resistor of which one end is electrically connected to a gate terminal of the NMOS transistor and the other end is electrically connected to a drain terminal of the NMOS transistor, and the current source may supply the current to the drain terminal of the NMOS transistor.

According to the oscillator of this application example, the drive level of the resonator is changed according to the current flowing through the drain terminal of the NMOS transistor, and thus it is possible to inspect the drive level dependency of the resonator based on an amount of the current flowing through the NMOS transistor.

APPLICATION EXAMPLE 3

In the oscillator according to the application example, a load capacitance of the resonator may be variably set by a second control signal which is input from the external terminal, and the drive level may be changed according to the load capacitance.

According to the oscillator of this application example, the drive level of the resonator is changed according to the load capacitance of the resonator that is variably set by the second control signal input from the external terminal, and thus it is possible to inspect the drive level dependency of the resonator while finely adjusting the drive level.

APPLICATION EXAMPLE 4

In the oscillator according to the application example, the amplification circuit may include an NMOS transistor, the oscillation circuit may include a first load capacitance which is electrically connected to a gate terminal of the NMOS transistor and a second load capacitance which is electrically connected to a drain terminal of the NMOS transistor, at least one of the first load capacitance and the second load capacitance may be variably set according to a second control signal which is input from the external terminal, and the drive level may be changed according to the first load capacitance and the second load capacitance.

According to the oscillator of this application example, the gate terminal and the drain terminal of the NMOS transistor are electrically connected to each other, and the drive level of the resonator is changed according to at least one of the first load capacitance and the second load capacitance of the resonator that is variably set by the second control signal input from the external terminal. Therefore, it is possible to inspect the drive level dependency of the resonator based on the signal of the drain terminal of the NMOS transistor while finely adjusting the drive level.

APPLICATION EXAMPLE 5

In the oscillator according to the application example, the drive level may increase as the first load capacitance increases, and the drive level may decrease as the second load capacitance increases.

According to the oscillator of this application example, at least one of the first load capacitance and the second load capacitance of the resonator is variably set, and thus it is possible to inspect the drive level dependency of the resonator while finely adjusting an increase or a decrease of the drive level of the resonator.

APPLICATION EXAMPLE 6

In the oscillator according to the application example, the first control signal may include at least one pulse, and the setting of the current may be switched each time the pulse is input to the external terminal.

According to the oscillator of this application example, the setting of the current supplied to the amplification circuit is switched each time the pulse is input to the external terminal, and thus it is possible to shorten an inspection time.

APPLICATION EXAMPLE 7

In the oscillator according to the application example, a negative resistance value of the oscillation circuit may be changed according to the current.

According to the oscillator of this application example, a negative resistance value of the oscillation circuit is changed according to the current which is variably set by the first control signal input from the external terminal. In a case where an impedance value of the resonator is larger than the negative resistance value, oscillation of the resonator is stopped, and thus it is possible to inspect the impedance value of the resonator based on the output signal of the oscillator.

APPLICATION EXAMPLE 8

The oscillator according to the application example may not include an external terminal which is electrically connected to a wiring connecting the resonator and the oscillation circuit and is used only for an inspection of the resonator.

According to the oscillator of this application example, there is no need to provide an external terminal (inspection terminal) for inspecting the drive level dependency of the resonator by probing both ends of the resonator. Thus, it is possible to realize downsizing of the oscillator and a reduction of a risk of breakdown of the oscillation circuit due to input of static electricity via the external terminal.

APPLICATION EXAMPLE 9

An electronic apparatus according to this application example includes the oscillator according to the application example.

APPLICATION EXAMPLE 10

A vehicle according to this application example includes the oscillator according to the application example.

According to these application examples, it is possible to realize an electronic apparatus and a vehicle with higher reliability, which include the oscillator capable of realizing downsizing and a reduction of a risk of breakdown due to static electricity and capable of inspecting the drive level dependency of the resonator.

APPLICATION EXAMPLE 11

A manufacturing method of an oscillator according to this application example includes: assembling an oscillator, the oscillator including an external terminal, a resonator, and an oscillation circuit that oscillates the resonator, in which the oscillation circuit includes an amplification circuit and a current source which supplies a current to the amplification circuit, in which the current is set according to a first control signal which is input from the external terminal and a drive level of the resonator is changed according to the current; and inputting the first control signal to the external terminal and inspecting a drive level dependency of the resonator based on a change of a signal output from the oscillator.

According to the manufacturing method of an oscillator of this application example, the drive level of the resonator is changed according to the current which is variably set by the first control signal input from the external terminal of the oscillator, and thus it is possible to inspect the drive level dependency of the resonator based on the output signal of the oscillator.

In addition, according to the manufacturing method of an oscillator of this application example, even in a configuration in which the oscillator is not provided with inspection terminals electrically connected to both ends of the resonator, it is possible to inspect the drive level dependency. Therefore, it is possible to realize downsizing of the oscillator and a reduction of a risk of breakdown due to static electricity.

APPLICATION EXAMPLE 12

In the manufacturing method of an oscillator according to the application example, a negative resistance value of the oscillation circuit of the oscillator may be changed according to the current, and the inspecting of the drive level dependency of the resonator may further include inspecting of an impedance value of the resonator based on the signal output from the oscillator.

According to the manufacturing method of an oscillator of this application example, the negative resistance value of the oscillation circuit is changed according to the current which is variably set by the first control signal input from the external terminal of the oscillator, and in a case where an impedance value of the resonator is larger than the negative resistance value, oscillation of the resonator is stopped. Therefore, it is possible to inspect the impedance value of the resonator based on the output signal of the oscillator.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments according to the invention will be described in detail with reference to the drawings. The embodiments described below do not unreasonably limit the contents of the invention described in the appended claims. In addition, all of the configurations described below are not necessarily essential configuration requirements of the invention.

1. Oscillator

1-1. First Embodiment

Configuration of Oscillator

Figure 1:
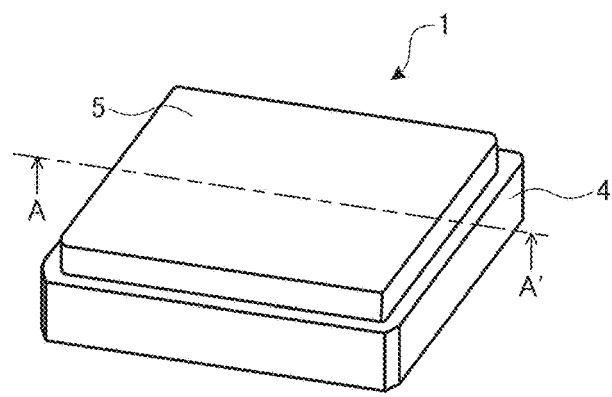
FIG. 1 is a perspective view of an oscillator according to the present embodiment.
Figure 2:
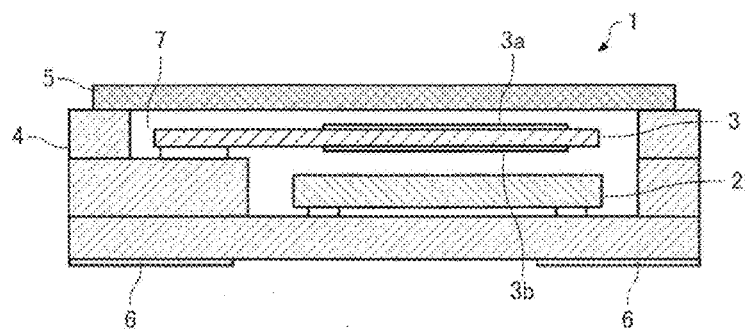
FIG. 2 is a sectional view of the oscillator according to the present embodiment.
Figure 3:
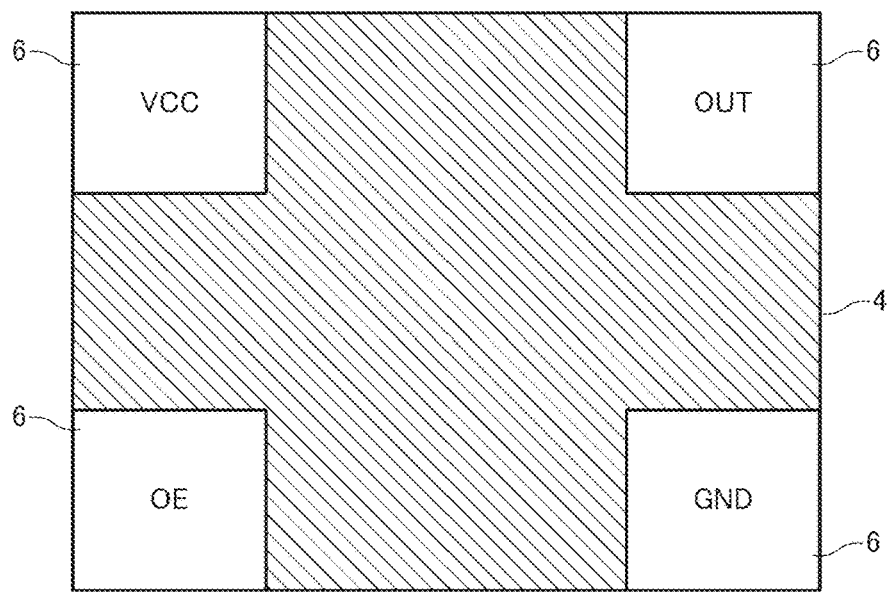
FIG. 3 is a bottom view of the oscillator according to the present embodiment.

FIGS. 1 to 3 are diagrams illustrating an example of a structure of an oscillator 1 according to the present embodiment. FIG. 1 is a perspective view of an oscillator 1, and FIG. 2 is a sectional view taken along line A-A' of FIG. 1. FIG. 3 is a bottom view of the oscillator 1.

As illustrated in FIGS. 1 to 3, the oscillator 1 is configured to include at least an oscillation integrated circuit (IC) 2, a resonator 3, and external terminals (external electrodes) 6, and include a package 4, a lid (cap) 5, and the like. In the present embodiment, the resonator 3 is a quartz crystal resonator using a quartz crystal as a substrate material, and is, for example, an AT cut quartz crystal resonator or a tuning fork type quartz crystal resonator. Here, the resonator 3 may be, for example, a surface acoustic wave (SAW) resonator, a piezoelectric resonator, a micro electro mechanical systems (MEMS) resonator, or the like. In addition, as a substrate material of the resonator 3, a piezoelectric single crystal such as a quartz crystal, a lithium tantalate, or a lithium niobate, a piezoelectric material such as a piezoelectric ceramic such as a lead zirconate titanate, or a silicon semiconductor material can be used. As a drive element of the resonator 3, an element using a piezoelectric effect may be used, or an electrostatic driving element using Coulomb force may be used.

The package 4 accommodates the oscillation IC 2 and the resonator 3 in the same space. Specifically, the package 4 is provided with a recess portion, and serves as a housing chamber 7 by covering the recess portion with a lid 5. Wirings (not illustrated) are provided inside the package 4 or on the surface of the recess portion, the wirings being used for electrically connecting each of two terminals (an XG terminal and an XD terminal illustrated in FIG. 3 to be described) of the oscillation IC 2 and each of two terminals (drive electrodes 3a and 3b) of the resonator 3. In addition, wirings (not illustrated) are provided inside the package 4 or on the surface of the recess portion, the wirings being used for electrically connecting each of the terminals of the oscillation IC 2 and the corresponding external terminal 6. The package 4 is not limited to the configuration in which the oscillation IC 2 and the resonator 3 are accommodated in the same space. For example, the package may be a so-called H type package in which the oscillation IC 2 is mounted on one surface of a substrate of the package and the resonator 3 is mounted on the other surface.

The resonator 3 includes metal drive electrodes 3a and 3b on the front and back surfaces thereof, and oscillates at a desired frequency (frequency required for the oscillator 1) according to the shape and mass of the resonator 3 including the drive electrodes 3a and 3b.

As illustrated in FIG. 3, the oscillator 1 is provided with four external terminals 6 of an external terminal VCC as a power supply terminal, an external terminal GND as a ground terminal, an external terminal OE as an input/output terminal, and an external terminal OUT as an input/output terminal, which are provided on the bottom surface of the oscillator 1 (the back surface of the package 4). The power supply voltage is supplied to the external terminal VCC, and the external terminal GND is grounded.

Figure 4:
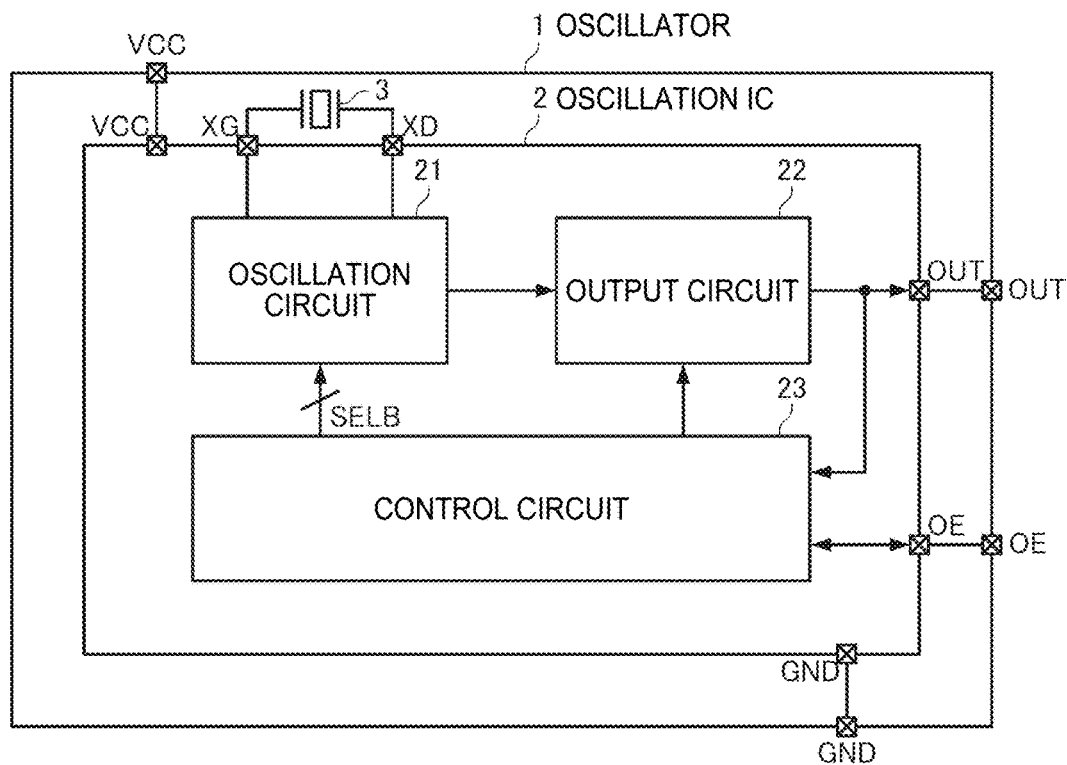
FIG. 4 is a functional block diagram of the oscillator according to the present embodiment.

FIG. 4 is a functional block diagram of the oscillator 1 according to the present embodiment. As illustrated in FIG. 4, the oscillator 1 according to the present embodiment is configured to include the oscillation IC 2 and the resonator 3. The oscillation IC 2 is provided with a VCC terminal as a power supply terminal, a GND terminal as a ground terminal, an OE terminal as an input/output terminal, an OUT terminal as an input/output terminal, and an XG terminal and an XD terminal as connection terminals for connection with the resonator 3. The VCC terminal, the GND terminal, the OE terminal, and the OUT terminal are exposed on the surface of the oscillation IC 2, and are respectively connected to the external terminals VCC, GND, OE, and OUT of the oscillator 1 provided in the package 4. In addition, the XG terminal is connected to one end (one terminal) of the resonator 3, and the XD terminal is connected to the other end (the other terminal) of the resonator 3.

The oscillator 1 according to the present embodiment does not include an external terminal that is electrically connected to the wiring for connecting the resonator 3 and an oscillation circuit 21 and is used only for the inspection of the resonator 3. That is, although inspection terminals for directly inspecting the resonator 3 by probing are not exposed on the outside, as will be described later, the oscillator 1 is configured such that the DLD inspection of the resonator 3 can be performed.

In the present embodiment, the oscillation IC 2 is configured to include an oscillation circuit 21, an output circuit 22, and a control circuit 23. The oscillation IC 2 may have a configuration in which a part of the components is omitted or changed, or in which another component is added.

The oscillation circuit 21 oscillates the resonator 3 by amplifying the output signal of the resonator 3 that is input from the XG terminal of the oscillation IC 2 using an amplification circuit (not illustrated in FIG. 4) and feeding the amplified signal back into the resonator 3 via the XD terminal of the oscillation IC 2, and outputs an oscillation signal based on the oscillation of the resonator 3.

The output circuit 22 receives the oscillation signal output from the oscillation circuit 21, and generates an oscillation signal of which the amplitude is adjusted to a desired level. The oscillation signal generated by the output circuit 22 is output to the outside of the oscillator 1 via the OUT terminal of the oscillation IC 2 and the external terminal OUT of the oscillator 1.

The control circuit 23 is a circuit for controlling the operation of the oscillation circuit 21 and the output circuit 22. In addition, based on a control signal which is input from the external terminal of the oscillator 1 via the terminal of the oscillation IC 2, the control circuit 23 sets an operation mode of the oscillator 1 (oscillation IC 2) to one of a plurality of modes including an external communication mode, a normal operation mode, and a DLD inspection mode, and performs a control according to the set operation mode. In the present embodiment, in a case where a control signal with a predetermined pattern is input from the external terminal OE of the oscillator 1 (OE terminal of the oscillation IC 2) within a predetermined period after the start of supply of the power supply voltage to the external terminal VCC of the oscillator 1 (VCC terminal of the oscillation IC 2) (that is, within a predetermined period after the power is supplied), after the predetermined period elapses, the control circuit 23 sets the operation mode of the oscillator 1 (oscillation IC 2) to the external communication mode. For example, the control circuit 23 may set, a period for which the resonator 3 starts to oscillate by power supply from the oscillator 1 (oscillation IC 2) and it is detected that the oscillation is stabilized (for example, the oscillation signal has a desired amplitude), as the predetermined period. In addition, the control circuit 23 may count the number of pulses of the oscillation signal and determine that the predetermined period elapses when the count value reaches a predetermined value. Further, for example, the control circuit 23 may measure the predetermined period based on an output signal of an RC time constant circuit that starts to operate when the power from the oscillator 1 (oscillation IC 2) is supplied.

In the external communication mode, a serial clock signal and a serial data signal are input in synchronization with each other from the external terminals OE and OUT of the oscillator 1 (OE and OUT terminals of the oscillation IC 2). In addition, the control circuit 23 performs sampling of the serial data signal for each edge of the serial clock signal, based on, for example, inter-integrated circuit ($I^2C$) bus standard, and performs processing such as setting of the operation mode and setting of control data in each operation mode, based on a command and data which are obtained by the sampling. For example, the control circuit 23 sets the operation mode of the oscillator 1 (oscillation IC 2) to the corresponding mode by sampling a command for transition of the operation mode of the oscillator 1 (oscillation IC 2) to the corresponding mode (the normal operation mode, the DLD inspection mode, or the like).

In the normal operation mode, when the control signal (output enable signal) input from the external terminal OE of the oscillator 1 (OE terminal of the oscillation IC 2) is active (for example, high level), the control circuit 23 performs a control to operate the oscillation circuit 21 and the output circuit 22. Accordingly, the oscillation signal is output from the external terminal OUT of the oscillator 1 (OUT terminal of the oscillation IC 2).

In addition, in the normal operation mode, when the control signal (output enable signal) input from the external terminal OE of the oscillator 1 (OE terminal of the oscillation IC 2) is inactive (for example, low level), the control circuit 23 operates the oscillation circuit 21, and performs a control to stop an oscillation output operation of the output circuit 22 in a case where standby bit data stored in a nonvolatile memory (not illustrated) is inactive (for example, 0). In a case where the standby bit data is active (for example, 1), the control circuit 23 performs a control to stop oscillation output operations of the oscillation circuit 21 and the operation of the output circuit 22. In any case of these cases, output of the oscillation signal from the external terminal OUT of the oscillator 1 (OUT terminal of the oscillation IC 2) is stopped.

In a case where the control signal with a predetermined pattern is not input from the external terminal OE of the oscillator 1 (OE terminal of the oscillation IC 2) within a predetermined period after the power is supplied, after the predetermined period elapses, the control circuit directly sets the operation mode of the oscillator 1 (oscillation IC 2) to the normal operation mode instead of the external communication mode.

Further, in the DLD inspection mode, the control circuit 23 sets an oscillation current of the oscillation circuit 21 according to values of m-bit current selection data SELB obtained by converting n-bit oscillation current setting data IOSC stored in an internal register (not illustrated), and performs a control to operate the oscillation circuit 21 and the output circuit 22. That is, the oscillation current is variably set by the oscillation current setting data IOSC. Therefore, an inspection device can inspect a drive level dependency of the resonator 3 based on a change of the oscillation signal outputted from the external terminal OUT of the oscillator 1, by setting the operation mode of the oscillator 1 (oscillation IC 2) to the DLD inspection mode and switching the setting of the oscillation current such that the drive level of the resonator 3 is changed. Specifically, the inspection device can inspect the drive level dependency of the resonator 3 by measuring an oscillation frequency for each setting of the oscillation current.

Figure 5A:
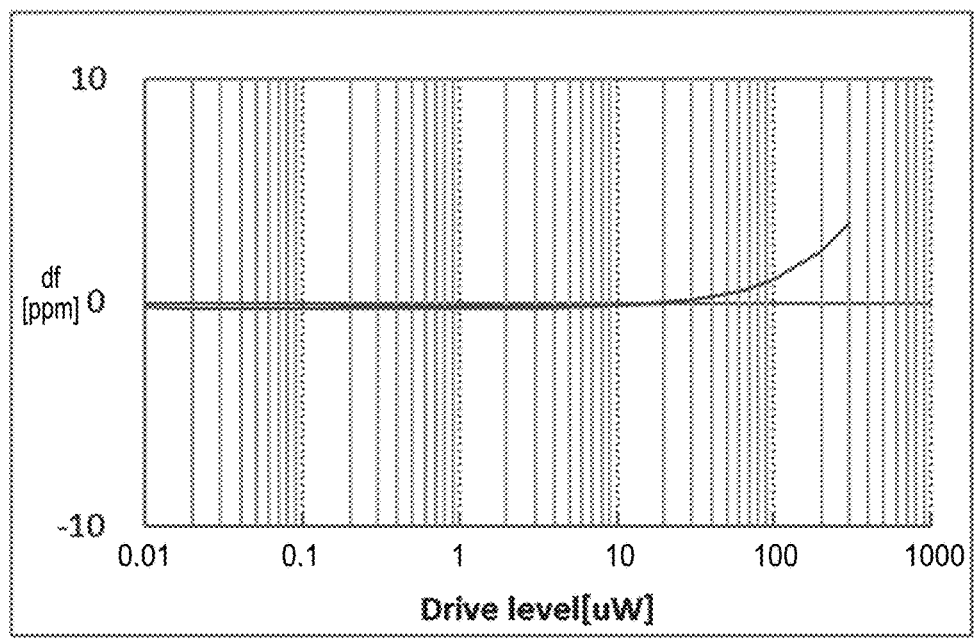
FIG. 5A is a graph illustrating an example of a drive level dependency in a case where a resonator is normal.
Figure 5B:
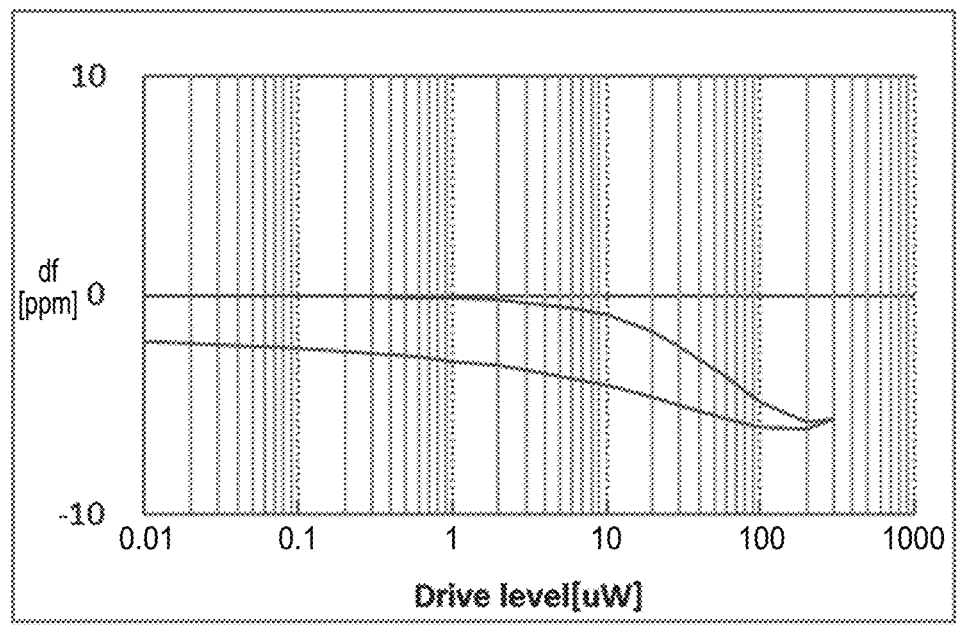
FIG. 5B is a graph illustrating an example of the drive level dependency in a case where the resonator is abnormal.
Figure 5C:
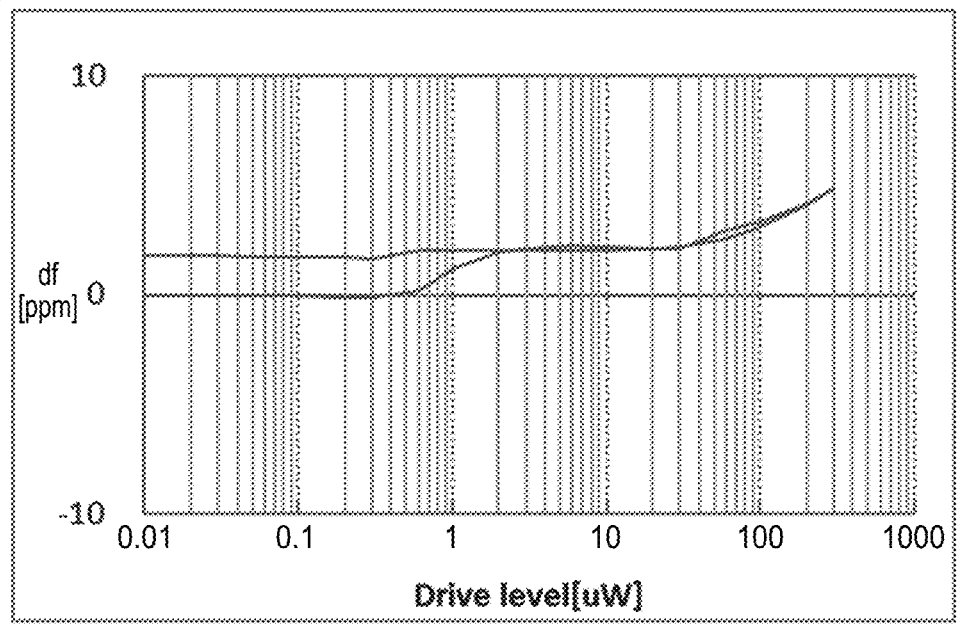
FIG. 5C is a graph illustrating an example of the drive level dependency in a case where the resonator is abnormal.
Figure 5D:
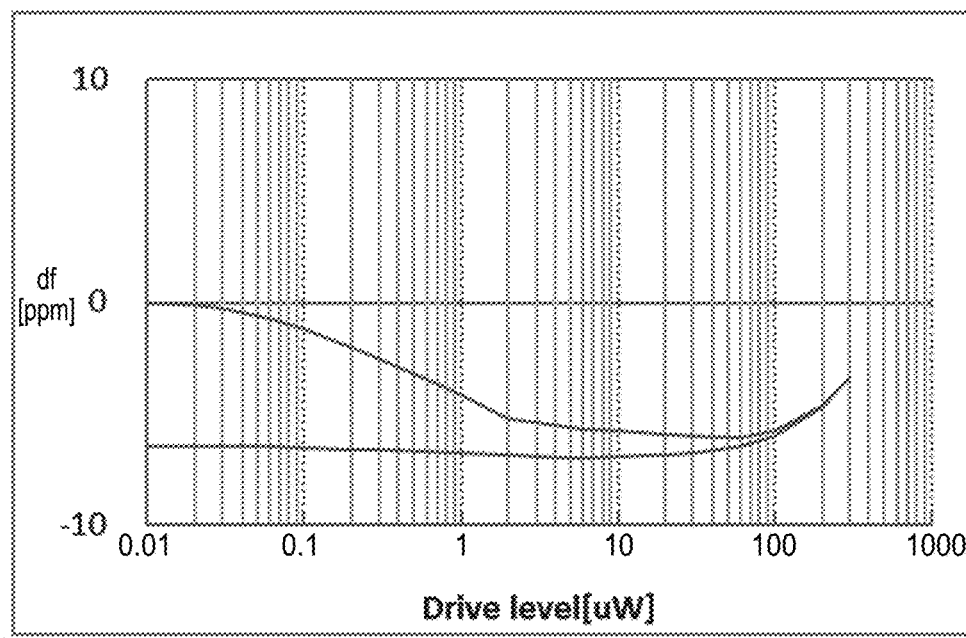
FIG. 5D is a graph illustrating an example of the drive level dependency in a case where the resonator is abnormal.
Figure 5E:
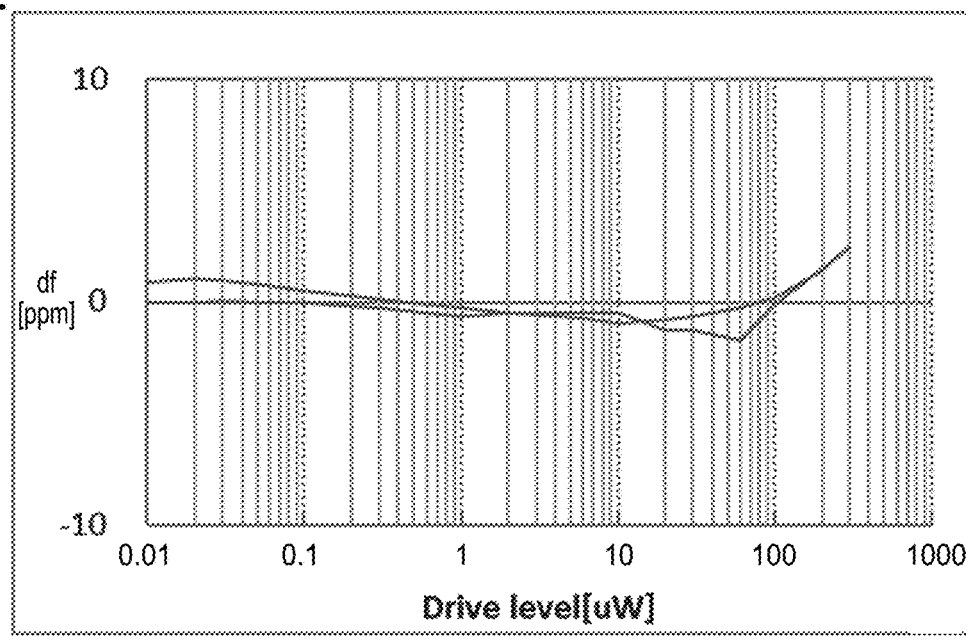
FIG. 5E is a graph illustrating an example of the drive level dependency in a case where the resonator is abnormal.

Here, FIGS. 5A to 5E are graphs respectively illustrating an example of the drive level dependency of the resonator 3, and specifically, are graphs based on results obtained by measuring the oscillation frequency for each drive level when the drive level gradually decreases to 0.01 μW after the drive level gradually increases from 0.01 μW to 300 μW. In FIGS. 5A to 5E, a horizontal axis represents the drive level (μW), and a vertical axis represents a frequency deviation (ppm) with reference to the oscillation frequency when the oscillation current is set to an initial setting (minimum setting) value. FIG. 5A is a graph in a case where the resonator 3 is normal. In FIG. 5A, a characteristic of the drive level dependency when the drive level gradually increases and a characteristic of the drive level dependency when the drive level gradually decreases are almost the same, and a hysteresis is not almost observed. On the other hand, FIGS. 5B to 5E are graphs in a case where a foreign matter is attached to the resonator 3. In the graphs of FIGS. 5B to 5E, a value of the frequency deviation at each drive level is greatly different from that of the graph (FIG. 5A) in the case where the resonator 3 is normal, and a large hysteresis is seen in the drive level dependency characteristics. This is because an apparent weight of the resonator 3 is increased due to the foreign matter attached to the resonator 3 and thus the oscillation frequency changes. In addition, this is because a vibration condition changes due to a drop of the foreign matter or a position change of the foreign matter by vibration of the resonator 3 and thus the oscillation frequency changes. Further, since the oscillation frequency of the resonator 3 differs depending on a weight and an attachment position of the foreign matter, as illustrated in the graphs of FIGS. 5B to 5E, the drive levels at which the frequency deviations change are greatly different from each other. As described above, in the DLD inspection, the oscillation frequency is measured by sweeping the drive levels in a wide range, and it is determined whether or not a condition is satisfied in each drive level, the condition in which the frequency deviation is included in a predetermined range and the hysteresis (a difference in the frequency deviation) is approximately 0, thereby it is possible to determine normality or abnormality of the resonator 3.

In the present embodiment, in order to efficiently perform the DLD inspection, in the DLD inspection mode, the control circuit 23 initializes the oscillation current setting data IOSC to a value for minimizing the oscillation current, and then changes the value of the oscillation current setting data IOSC each time a pulse is input from the external terminal OE of the oscillator 1 (OE terminal of the oscillation IC 2). For example, the oscillation current increases step by step and then decreases step by step when the oscillation current becomes a maximum value.

Configuration of Oscillation Circuit

Figure 6:
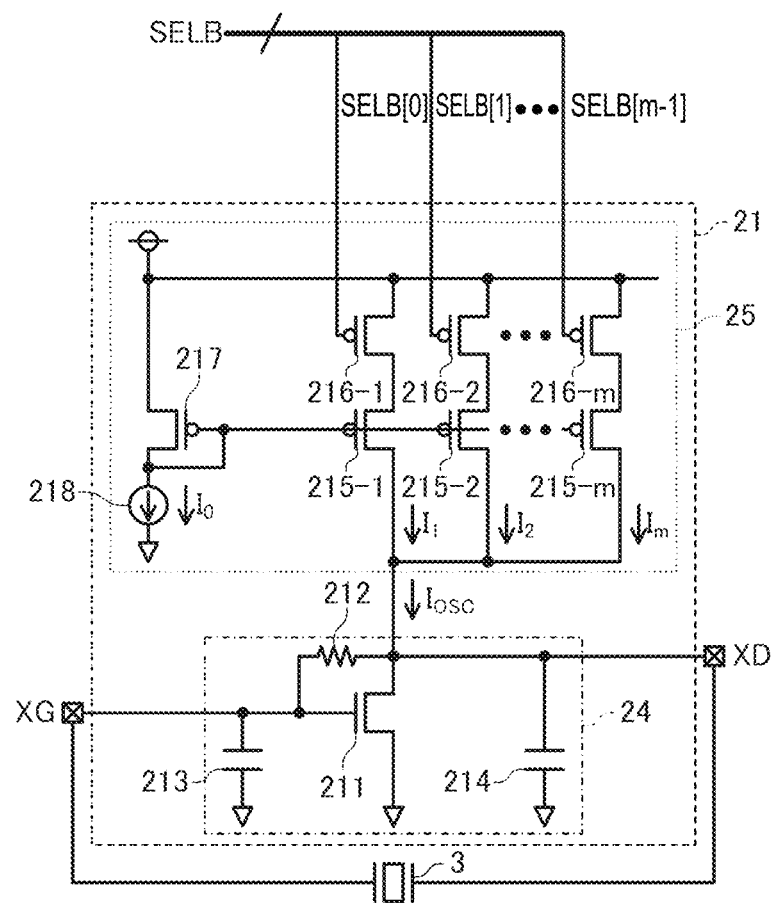
FIG. 6 is a diagram illustrating a configuration example of an oscillation circuit of the oscillator according to the first embodiment.

FIG. 6 is a diagram illustrating a configuration example of the oscillation circuit 21 of the oscillator 1 according to the first embodiment. In FIG. 6, a connection between the oscillation circuit 21 and the resonator 3 is also illustrated, and a so-called pierce oscillation circuit is configured with the oscillation circuit 21 and the resonator 3. As illustrated in FIG. 6, the oscillation circuit 21 is configured to include a negative-channel metal oxide semiconductor (NMOS) transistor 211, a resistor 212, a capacitor 213, a capacitor 214, m positive-channel metal oxide semiconductor (PMOS) transistors 215-1 to 215-m, m PMOS transistors 216-1 to 216-m, a PMOS transistor 217, and a constant current source 218. The oscillation circuit 21 may have a configuration in which a part of the components is omitted or changed, or in which another component is added.

The gate terminal of the NMOS transistor 211 is electrically connected to the XG terminal, the drain terminal of the NMOS transistor 211 is electrically connected to the XD terminal, and the source terminal of the NMOS transistor 211 is grounded to an analog ground.

One end of the resistor 212 is electrically connected to the XG terminal (the gate terminal of the NMOS transistor 211), and the other end is electrically connected to the XD terminal (the drain terminal of the NMOS transistor 211). That is, both ends of the resistor 212 are electrically connected to the gate terminal and the drain terminal of the NMOS transistor 211, respectively.

One end of the capacitor 213 is electrically connected to the XG terminal (the gate terminal of the NMOS transistor 211), and the other end of the capacitor 213 is grounded to the analog ground.

One end of the capacitor 214 is electrically connected to the XD terminal (the drain terminal of the NMOS transistor 211), and the other end of the capacitor 214 is grounded to the analog ground.

Each of the gate terminals of the PMOS transistors 215-1 to 215-m is electrically connected to the gate terminal of the PMOS transistor 217 in common. Each of the source terminals of the PMOS transistors 215-1 to 215-m is electrically connected to each of the drain terminals of the PMOS transistors 216-1 to 216-m, respectively. Each of the drain terminals of the PMOS transistors 215-1 to 215-m is electrically connected to the drain terminal of the NMOS transistor 211 in common.

A voltage having a level (low level or high level) corresponding to a value (0 or 1) of each bit of the m-bit current selection data SELB is respectively applied to each of the gate terminals of the PMOS transistors 216-1 to 216-m. Each of the source terminals of the PMOS transistors 216-1 to 216-m is electrically connected to an analog power supply in common. Each of the drain terminals of the PMOS transistors 216-1 to 216-m is electrically connected to each of the source terminals of the PMOS transistors 215-1 to 215-m, respectively.

The gate terminal of the PMOS transistor 217 is electrically connected to each of the gate terminals of the PMOS transistors 215-1 to 215-m in common, the source terminal of the PMOS transistor 217 is electrically connected to the analog power supply, and the drain terminal of the PMOS transistor 217 is connected to one end of the constant current source 218.

One end of the constant current source 218 is electrically connected to the drain terminal of the PMOS transistor 217, and the other end of the constant current source 218 is grounded to the analog ground.

In the oscillation circuit 21 having such a configuration, the capacitor 213 and the capacitor 214 function as a load capacitance of the resonator 3, the resistor 212 functions as a feedback resistor, and the NMOS transistor 211 functions as an amplification element that amplifies the oscillation signal input from the resonator 3 via the XG terminal and outputs the amplified signal to the resonator 3 via the XD terminal. That is, an amplification circuit 24 is configured with the NMOS transistor 211, the resistor 212, the capacitor 213, and the capacitor 214.

In addition, a current mirror circuit is configured with the PMOS transistors 215-1 to 215-$m$, the PMOS transistors 216-1 to 216-$m$, the PMOS transistor 217, and the constant current source 218. Therefore, assuming that the size ratios between each of the PMOS transistors 215-1 to 215-$m$ and the PMOS transistor 217 are respectively $N_1$ to $N_m$, when each of the PMOS transistors 216-1 to 216-$m$ is in an ON state (a state where the source terminals and the drain terminals thereof are electrically connected to each other), currents $I_1$ to $I_m$, which are $N_1$ to $N_m$ times the current $I_0$ flowing through the PMOS transistor 217 (current flowing through the constant current source 218), flow from each of the source terminals of the PMOS transistors 215-1 to 215-$m$ to each of the drain terminals of the PMOS transistors 215-1 to 215-$m$. On the other hand, when each of the PMOS transistors 216-1 to 216-$m$ is in an OFF state (a state where the source terminals and the drain terminals thereof are not electrically connected to each other), no current flows from each of the source terminals of the PMOS transistors 215-1 to 215-$m$ to each of the drain terminals of the PMOS transistors 215-1 to 215-$m$. Here, when a value of each of the bits SELB[0] to SELB[m−1] of the current selection data SELB is 0, each of the PMOS transistors 216-1 to 216-$m$ enters an ON state, and when a value of each of the bits SELB[0] to SELB[m−1] is 1, each of the PMOS transistors 216-1 to 216-$m$ enters an OFF state.

The oscillation current $I_{OSC}$, which flows through the drain terminal of the NMOS transistor 211, is the sum of the currents flowing from each of the source terminals of the PMOS transistors 215-1 to 215-$m$ to each of the drain terminals of the PMOS transistors 215-1 to 215-$m$, and thus the oscillation current $I_{OSC}$ is represented by the following equation (1).

$$I_{OSC} = \overline{SELB[0]} \cdot I_1 + \overline{SELB[1]} \cdot I_2 + \ldots + \overline{SELB[m-1]} \cdot I_m \quad (1)$$

In this manner, a current source 25 that supplies the oscillation current $I_{OSC}$ to the amplification circuit 24 is configured with the PMOS transistors 215-1 to 215-$m$, the PMOS transistors 216-1 to 216-$m$, the PMOS transistor 217, and the constant current source 218. Specifically, the current source 25 supplies the oscillation current $I_{OSC}$ to the drain terminal of the NMOS transistor 211 included in the amplification circuit 24.

The oscillation current $I_{OSC}$ supplied to the amplification circuit 24 is variably set according to a control signal (an example of "a first control signal") input from the external terminal of the oscillator 1. That is, as described above, in the DLD inspection mode, a control signal including at least one pulse is input from the external terminal OE of the oscillator 1 (OE terminal of the oscillation IC 2), and each time the pulse is input, the setting of the oscillation current $I_{OSC}$ is switched. For example, the oscillation current $I_{OSC}$ increases step by step and then decreases step by step when the oscillation current becomes the maximum value.

For example, when the PMOS transistors 216-1 to 216-$m$ sequentially enter into an ON state one by one and SELB[0] to SELB[m−1] sequentially change from 1 to 0 in Equation (1), the oscillation current $I_{OSC}$ increases to $I_1$, $I_1+I_2, \ldots$, and so on. When the oscillation current becomes the maximum value $I_1+I_2+\ldots+I_m$, the PMOS transistors 216-1 to 216-$m$ sequentially enter into an OFF state, and thus the oscillation current $I_{OSC}$ decreases to $I_1+I_2+\ldots+I_m$, $I_1+I_2+\ldots+I_{m-1}$.

Figure 7:
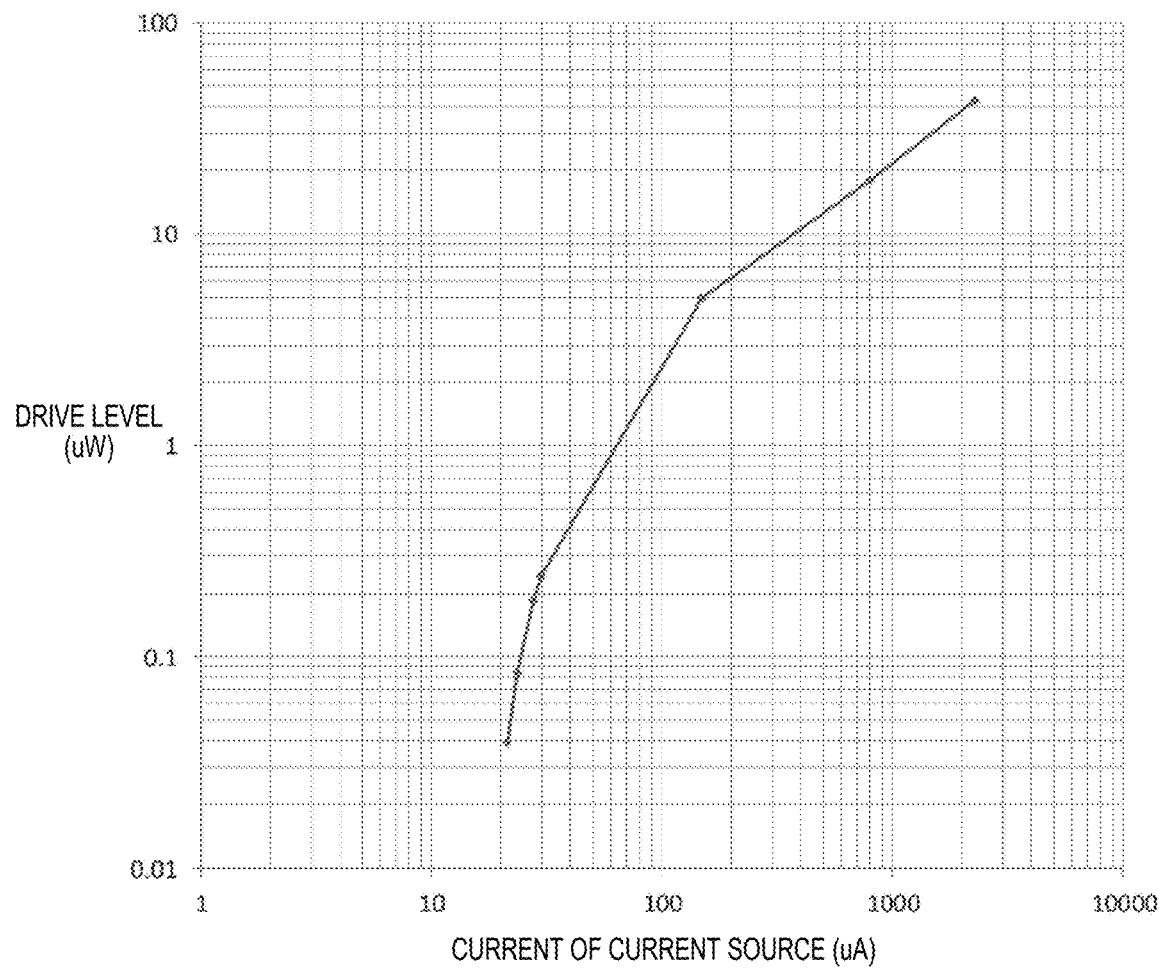
FIG. 7 is a graph illustrating an example of a relationship between an oscillation current and a drive level of the resonator.

In the present embodiment, as a setting value of the oscillation current setting data IOSC increases, the oscillation current $I_{OSC}$ increases, and as the oscillation current $I_{OSC}$ increases, the drive level of the resonator 3 increases. FIG. 7 is a graph illustrating an example of a relationship between the oscillation current $I_{OSC}$ (the current of the current source 25) and the drive level of the resonator 3. In FIG. 7, a horizontal axis represents a current (μA), and a vertical axis represents a drive level (μW). As illustrated in FIG. 7, as the oscillation current $I_{OSC}$ increases (the setting value of the oscillation current setting data IOSC increases), the drive level of the resonator 3 increases.

Manufacturing Method of Oscillator

Figure 8:
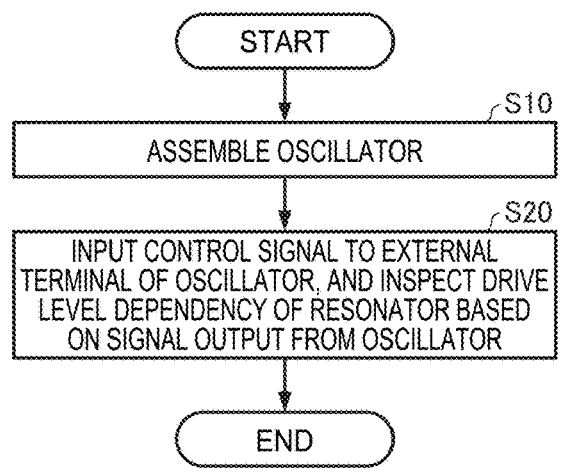
FIG. 8 is a flowchart illustrating an example of a manufacturing method of the oscillator according to the present embodiment.

FIG. 8 is a flowchart illustrating an example of a manufacturing method of the oscillator according to the present embodiment. The manufacturing method of the oscillator according to the present embodiment includes steps S10 to S20 illustrated in FIG. 8. In the manufacturing method of the oscillator according to the present embodiment, apart of steps S10 to S20 may be omitted or changed, or other steps may be added.

As illustrated in FIG. 8, in the present embodiment, first, the oscillator 1 including the resonator 3 and the oscillation IC 2 is assembled (step S10).

Next, the inspection device inputs the control signal to the external terminal of the oscillator 1, and inspects the drive level dependency (DLD) of the resonator 3 based on a signal output from the oscillator 1 (step S20).

Figure 9:
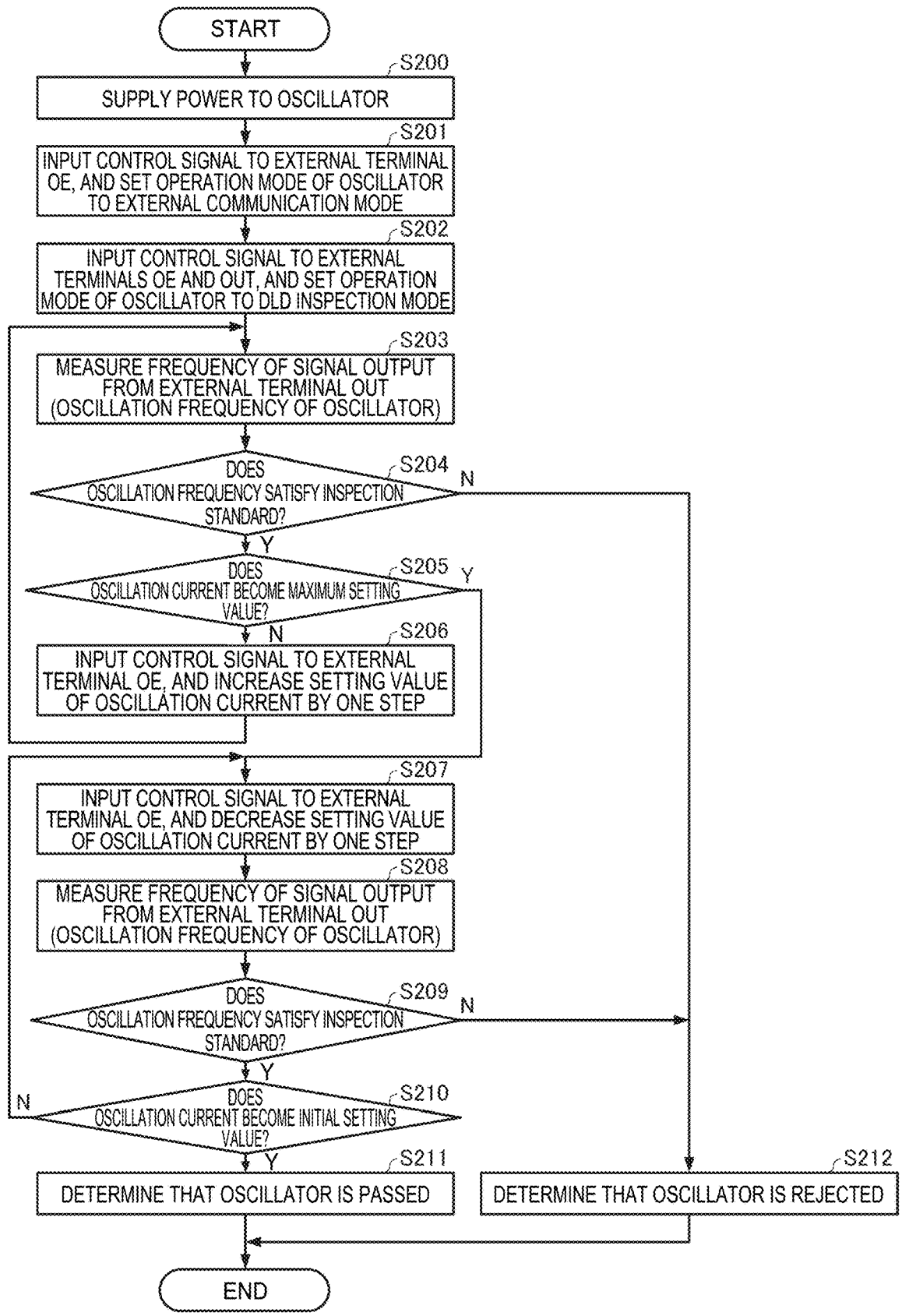
FIG. 9 is a flowchart illustrating an example of a detailed procedure of a DLD inspection of the resonator of the oscillator according to the first embodiment.
Figure 10:
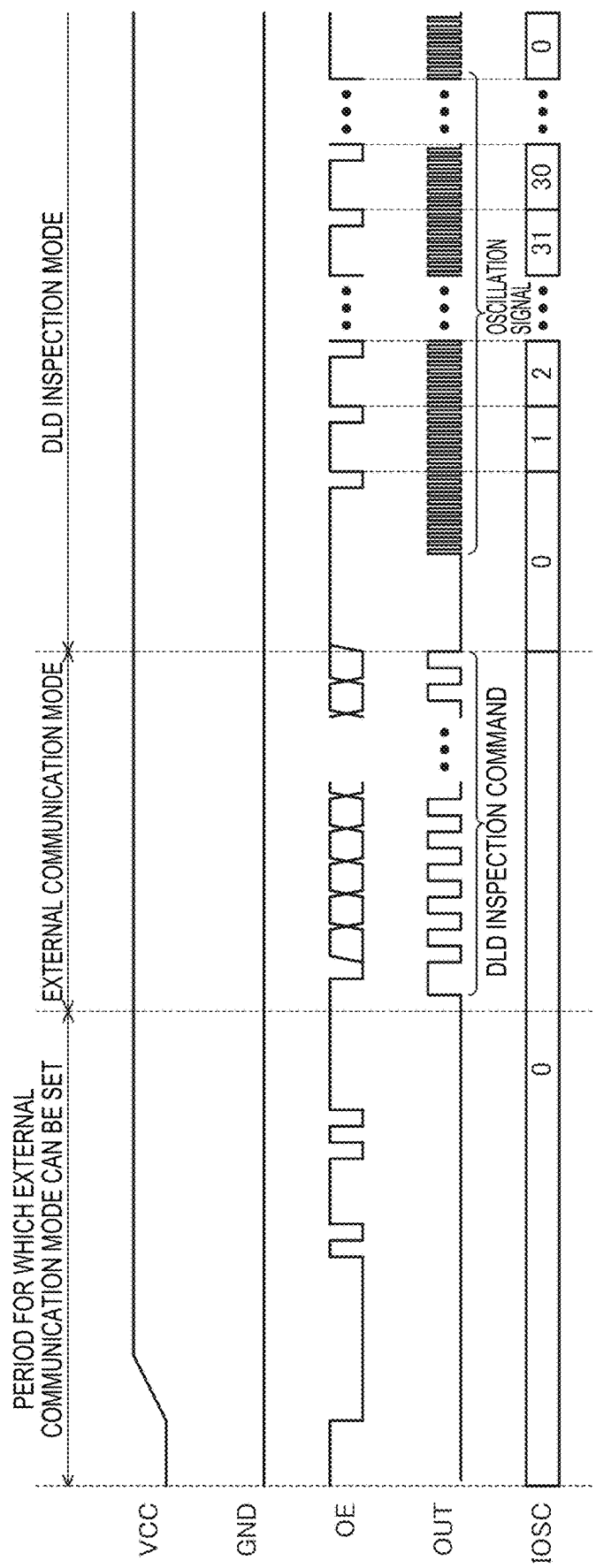
FIG. 10 is a diagram illustrating an example of signal waveforms of external terminals of the oscillator when inspecting the oscillator according to the flowchart of FIG. 9.

FIG. 9 is a flowchart illustrating an example of a detailed procedure of step S20 (DLD inspection of the resonator 3) illustrated in FIG. 8. FIG. 10 is a diagram illustrating an example of signal waveforms of the external terminals VCC, GND, OE, and OUT of the oscillator 1 when performing the DLD inspection of the resonator 3 according to the flowchart of FIG. 9. FIG. 10 illustrates an example in a case where the bit number n of the oscillation current setting data IOSC is 5.

In the example of FIG. 9, first, the inspection device supplies the power to the oscillator 1 (step S200). That is, as illustrated in FIG. 10, a desired power supply voltage is supplied to the external terminal VCC of the oscillator 1.

Next, the inspection device inputs the control signal to the external terminal OE, and sets the operation mode of the oscillator 1 to the external communication mode (step S201). That is, as illustrated in FIG. 10, within a predetermined period after the power is supplied, the inspection device inputs a predetermined signal with a predetermined pattern to the external terminal OE of the oscillator 1, and sets the operation mode of the oscillator 1 to the external communication mode.

Next, the inspection device inputs the control signal to the external terminals OE and OUT, and sets the operation mode of the oscillator 1 to the DLD inspection mode (step S202). That is, as illustrated in FIG. 10, in the external communication mode, the inspection device respectively inputs a serial clock signal and a serial data signal (DLD inspection command) to the external terminals OE and OUT of the oscillator 1, and sets the operation mode of the oscillator 1 to the DLD inspection mode.

Next, the inspection device measures a frequency of the signal output from the external terminal OUT (the oscillation frequency of the oscillator 1) (step S203).

Next, the inspection device determines whether or not the oscillation frequency measured in step S203 satisfies an inspection standard (step S204). In step S204, the inspection device determines whether or not a frequency deviation of the oscillation frequency measured in step S203 is included in a desired range in consideration of manufacturing variations of the resonator 3 (for example, a range of a design value±1 ppm) based on the oscillation frequency when the value of the oscillation current setting data IOSC is 0 (initial value).

In a case where the oscillation frequency does not satisfy the inspection standard (N in step S204), the inspection device determines that the oscillator 1 is rejected in the inspection (step S212). In addition, in a case where the oscillation frequency satisfies the inspection standard (Y in step S204), when the oscillation current $I_{OSC}$ does not become the maximum setting value (when the oscillation current setting data IOSC is not set to the maximum value $2^n-1$ (for example, 31)) (N in step S205), the inspection device inputs the control signal to the external terminal OE, and increases the setting value of the oscillation current $I_{OSC}$ by one step (step S206). That is, as illustrated in FIG. 10, in the DLD inspection mode, the inspection device inputs a pulse to the external terminal OE of the oscillator 1, and increases the value of the oscillation current setting data IOSC from 0 (initial value) to 1.

Then, the inspection device repeatedly performs steps S203 to S206 until the oscillation current $I_{OSC}$ becomes the maximum setting value (N in step S205). In the example of FIG. 10, the inspection device inputs a pulse to the external terminal OE of the oscillator 1, measures the oscillation frequency each time the value of the oscillation current setting data IOSC increases from 1 to 31 step by step, and determines whether or not the oscillation frequency satisfies the inspection standard.

Next, when the oscillation current $I_{OSC}$ becomes the maximum setting value (the oscillation current setting data IOSC becomes the maximum value $2^{n-1}$) (Y in step S205), the inspection device inputs the control signal to the external terminal OE, and decreases the setting value of the oscillation current $I_{OSC}$ by one step (step S207). That is, as illustrated in FIG. 10, in the DLD inspection mode, the inspection device inputs a pulse to the external terminal OE of the oscillator 1, and decreases the value of the oscillation current setting data IOSC from 31 (maximum value) to 30.

Next, the inspection device measures a frequency of the signal output from the external terminal OUT (the oscillation frequency of the oscillator 1) (step S208).

Next, the inspection device determines whether or not the oscillation frequency measured in step S208 satisfies the inspection standard (step S209). In step S209, the inspection device determines whether or not a frequency deviation of the oscillation frequency measured in step S208 is included in a desired range in consideration of manufacturing variations of the resonator 3 (for example, a range of a design value±1 ppm) based on the oscillation frequency when the value of the oscillation current setting data IOSC is 0 (initial value). In addition, the inspection device determines whether or not a difference (absolute value) between the oscillation frequency measured in step S203 and the oscillation frequency measured in step S208 at the same setting value of the oscillation current $I_{OSC}$, that is, a hysteresis is within a desired range (for example, a range of 0.5 ppm).

In a case where the oscillation frequency does not satisfy the inspection standard (N in step S209), the inspection device determines that the oscillator 1 is rejected in the inspection (step S212). In addition, in a case where the oscillation frequency satisfies the inspection standard (Y in step S204), the inspection device repeatedly performs steps S207 to S209 until the oscillation current $I_{OSC}$ becomes the initial setting value (the oscillation current setting data IOSC becomes the initial value 0) (N in step S210). In the example of FIG. 10, the inspection device inputs a pulse to the external terminal OE of the oscillator 1, measures the oscillation frequency each time the value of the oscillation current setting data IOSC decreases from 30 to 0 step by step, and determines whether or not the oscillation frequency satisfies the inspection standard.

Finally, when the oscillation current $I_{OSC}$ becomes the initial setting value (the oscillation current setting data IOSC becomes the initial value 0) (Y in step S210), the inspection device determines that the oscillator 1 is passed in the inspection (step S211).

Operation and Effect

As described above, in the oscillator 1 according to the first embodiment, the drive level of the resonator 3 is changed according to the oscillation current $I_{OSC}$ (current flowing through the drain terminal of the NMOS transistor 211 included in the oscillation circuit 21) which is variably set by the control signal input from the external terminals OE and OUT. Specifically, as the oscillation current $I_{OSC}$ is set to a larger value, the drive level of the resonator 3 increases. In contrast, as the oscillation current $I_{OSC}$ is set to a smaller value, the drive level of the resonator 3 decreases. Therefore, according to the oscillator 1 of the first embodiment, it is possible to inspect the drive level dependency of the resonator 3 by measuring the frequency of the signal output from the external terminal OUT (signal of the drain terminal of the NMOS transistor 211).

In addition, in the oscillator 1 according to the first embodiment, since the external terminals OE and OUT which are used in the normal operation mode are also used as inspection terminals, dedicated inspection terminals for inspecting the drive level dependency of the resonator 3 by probing both ends of the resonator 3 (inspection terminals electrically connected to both ends of the resonator 3) are not provided. Therefore, according to the oscillator 1 of the first embodiment, it is possible to realize downsizing of the oscillator 1 and a reduction of a risk of breakdown of the oscillation circuit 21 due to input of static electricity via the external terminal.

Furthermore, in the oscillator 1 according to the first embodiment, in the DLD inspection mode, the setting of the oscillation current $I_{OSC}$ (drive level of the resonator 3) is switched each time a pulse is input from the external terminal OE. Therefore, according to the oscillator 1 of the first embodiment, it is possible to shorten a time required for inspecting the drive level dependency of the resonator 3, by measuring the frequency of the signal output from the external terminal OUT each time a pulse is input from the external terminal OE of the oscillator 1.

1-2. Second Embodiment

Hereinafter, in the oscillator 1 according to the second embodiment, the same description as in the first embodiment will be omitted or simplified, and contents different from those of the first embodiment will mainly be described. Since a structure and a functional block diagram of the oscillator 1 according to the second embodiment are the same as those of the oscillator 1 according to the first embodiment (FIGS. 1 to 4), the illustration and description thereof will be omitted.

Figure 11:
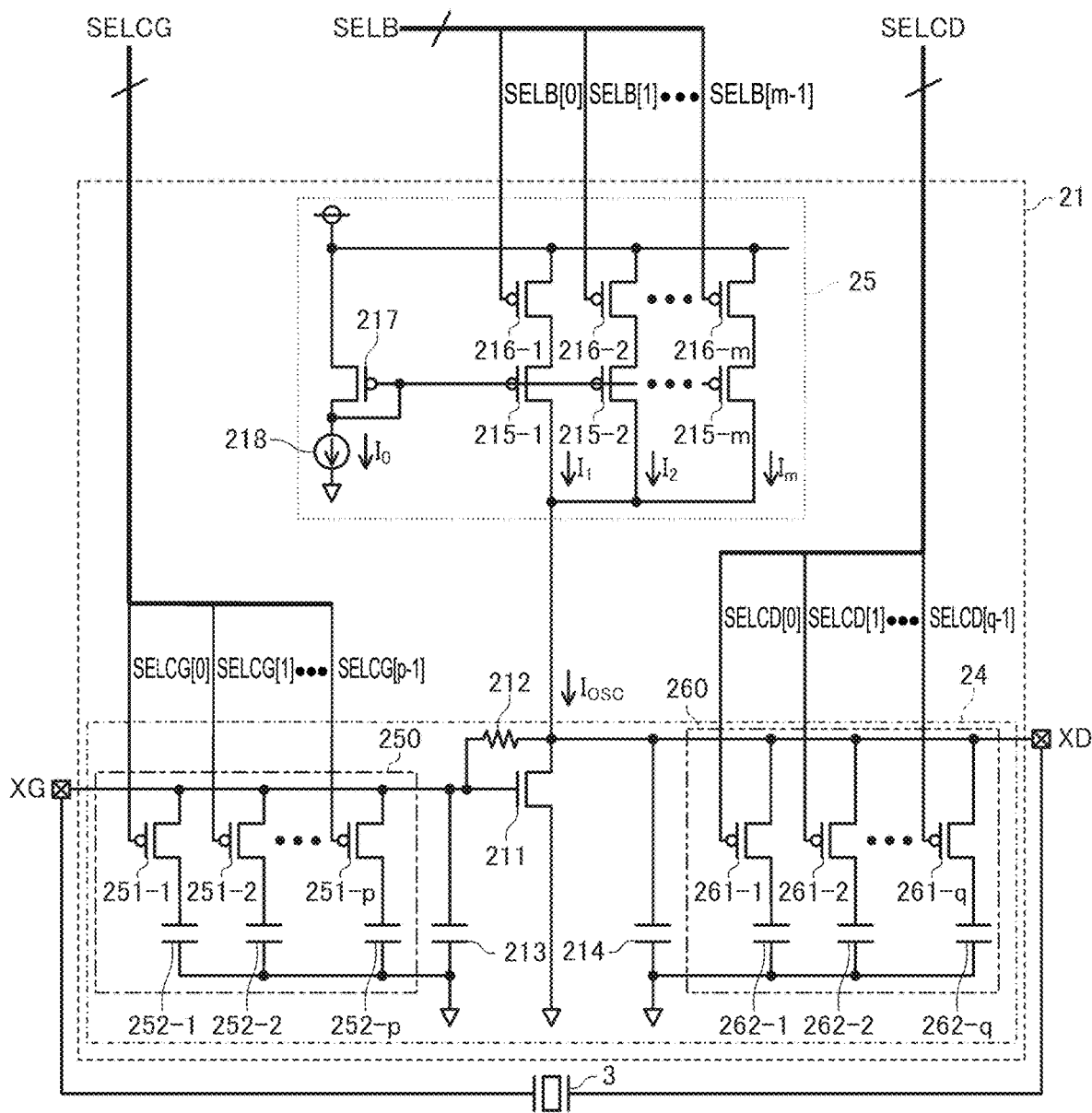
FIG. 11 is a diagram illustrating a configuration example of the oscillation circuit of the oscillator according to a second embodiment.

FIG. 11 is a diagram illustrating a configuration example of the oscillation circuit 21 of the oscillator 1 according to the second embodiment. In FIG. 11, the same reference numerals are given to the same components as those illustrated in FIG. 6. In the example of FIG. 11, a variable capacitance circuit 250 and a variable capacitance circuit 260 are added to the configuration illustrated in FIG. 6.

The variable capacitance circuit 250 is configured to include p switching elements 251-1 to 251-$p$ and $p$ capacitors 252-1 to 252-$p$.

One end of each of the switching elements 251-1 to 251-$p$ is electrically connected to the XG terminal (the gate terminal of the NMOS transistor 211) in common, and the other end of each of the switching elements 251-1 to 251-$p$ is electrically connected to one end of each of the capacitors 252-1 to 252-$p$. A voltage with a level (low level/high level) corresponding to a value (0/1) of each bit of p-bit first load capacitance selection data SELCG stored in an internal register (not illustrated) is applied to a control terminal of each of the switching elements 251-1 to 251-$p$. When the voltage with a high level is applied to the control terminal of each of the switching elements 251-1 to 251-$p$, each of the switching elements 251-1 to 251-$p$ enters into a conduction state (ON state), and when the voltage with a low level is applied to the control terminal of each of the switching elements 251-1 to 251-$p$, each of the switching elements 251-1 to 251-$p$ enters into a non-conduction state (OFF state).

One end of each of the capacitors 252-1 to 252-$p$ is electrically connected to the other end of each of the switching elements 251-1 to 251-$p$, and the other end of each of the capacitors 252-1 to 252-$p$ is grounded to the analog ground in common. Therefore, depending on whether each of the switching elements 251-1 to 251-$p$ enters into a conduction state or a non-conduction state, one end of each of the capacitors 252-1 to 252-$p$ is electrically connected and disconnected to and from the XG terminal (gate terminal of the NMOS transistor 211). A capacitance value of the variable capacitance circuit 250 is the sum of the capacitance values of the capacitors which are electrically connected to the XG terminal (gate terminal of the NMOS transistor 211) among the capacitors 252-1 to 252-$p$.

The variable capacitance circuit 260 is configured to include q switching elements 261-1 to 261-$q$ and $q$ capacitors 262-1 to 262-$q$.

One end of each of the switching elements 261-1 to 261-$q$ is electrically connected to the XD terminal (drain terminal of the NMOS transistor 211) in common, and the other end of each of the switching elements 261-1 to 261-$q$ is electrically connected to one end of each of the capacitors 262-1 to 262-$q$. A voltage with a level (low level/high level) corresponding to a value (0/1) of each bit of q-bit second load capacitance selection data SELCD stored in an internal register (not illustrated) is applied to a control terminal of each of the switching elements 261-1 to 261-$q$. When the voltage with a high level is applied to the control terminal of each of the switching elements 261-1 to 261-$q$, each of the switching elements 261-1 to 261-$q$ enters into a conduction state (ON state), and when the voltage with a low level is applied to the control terminal of each of the switching elements 261-1 to 261-$q$, each of the switching elements 261-1 to 261-$q$ enters into a non-conduction state (OFF state).

One end of each of the capacitors 262-1 to 262-$q$ is electrically connected to the other end of each of the switching elements 261-1 to 261-$q$, and the other end of each of the capacitors 262-1 to 262-$q$ is grounded to the analog ground in common. Therefore, depending on whether each of the switching elements 261-1 to 261-$q$ enters into a conduction state or a non-conduction state, one end of each of the capacitors 262-1 to 262-$q$ is electrically connected and disconnected to and from the XD terminal (drain terminal of the NMOS transistor 211). A capacitance value of the variable capacitance circuit 260 is the sum of the capacitance values of the capacitors which are electrically connected to the XD terminal (drain terminal of the NMOS transistor 211) among the capacitors 262-1 to 262-$q$.

The other configuration of the oscillation circuit 21 of the oscillator 1 according to the second embodiment is similar to that of the first embodiment (FIG. 6).

In the oscillation circuit 21 with the configuration, the variable capacitance circuit 250 and the capacitor 213 that are connected to the XG terminal (the gate terminal of the NMOS transistor 211) function as a first load capacitance of the resonator 3, and the variable capacitance circuit 260 and the capacitor 214 that are connected to the XD terminal (drain terminal of the NMOS transistor 211) function as a second load capacitance of the resonator 3. A capacitance value Cg of the first load capacitance is changed according to the first load capacitance selection data SELCG, and a capacitance value Cd of the second load capacitance is changed according to the second load capacitance selection data SELCD. The first load capacitance selection data SELCG and the second load capacitance selection data SELCD can be set from the external terminals OE and OUT of the oscillator 1 (the OE terminal and the OUT terminal of the oscillation IC 2) in the external communication mode. Therefore, the load capacitance of the resonator 3 (the first load capacitance and the second load capacitance) is variably set by the control signal which is input from the external terminal of the oscillator 1.

Figure 12:
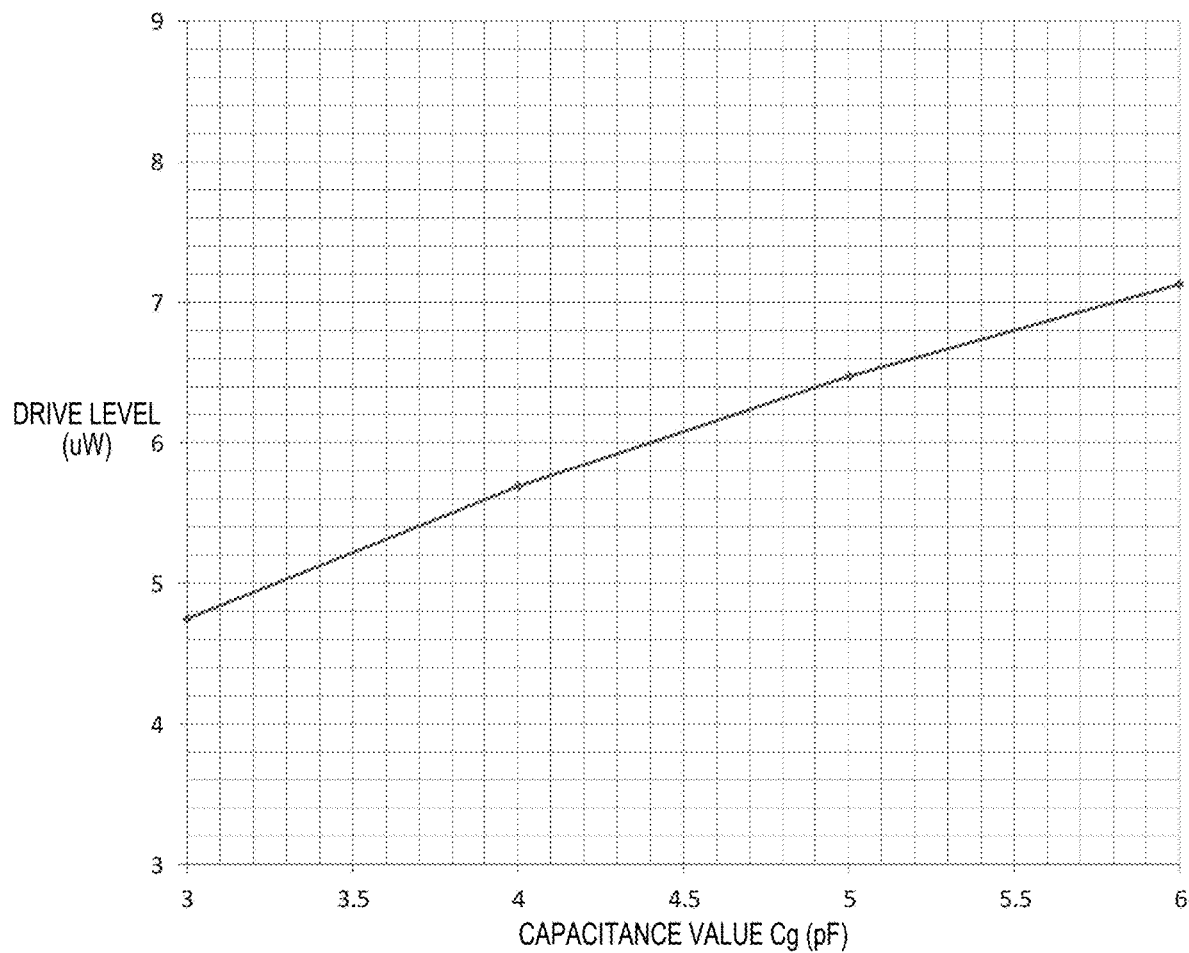
FIG. 12 is a graph illustrating an example of a relationship between a capacitance value of a first load capacitance and the drive level of the resonator in the oscillator according to the second embodiment.
Figure 13:
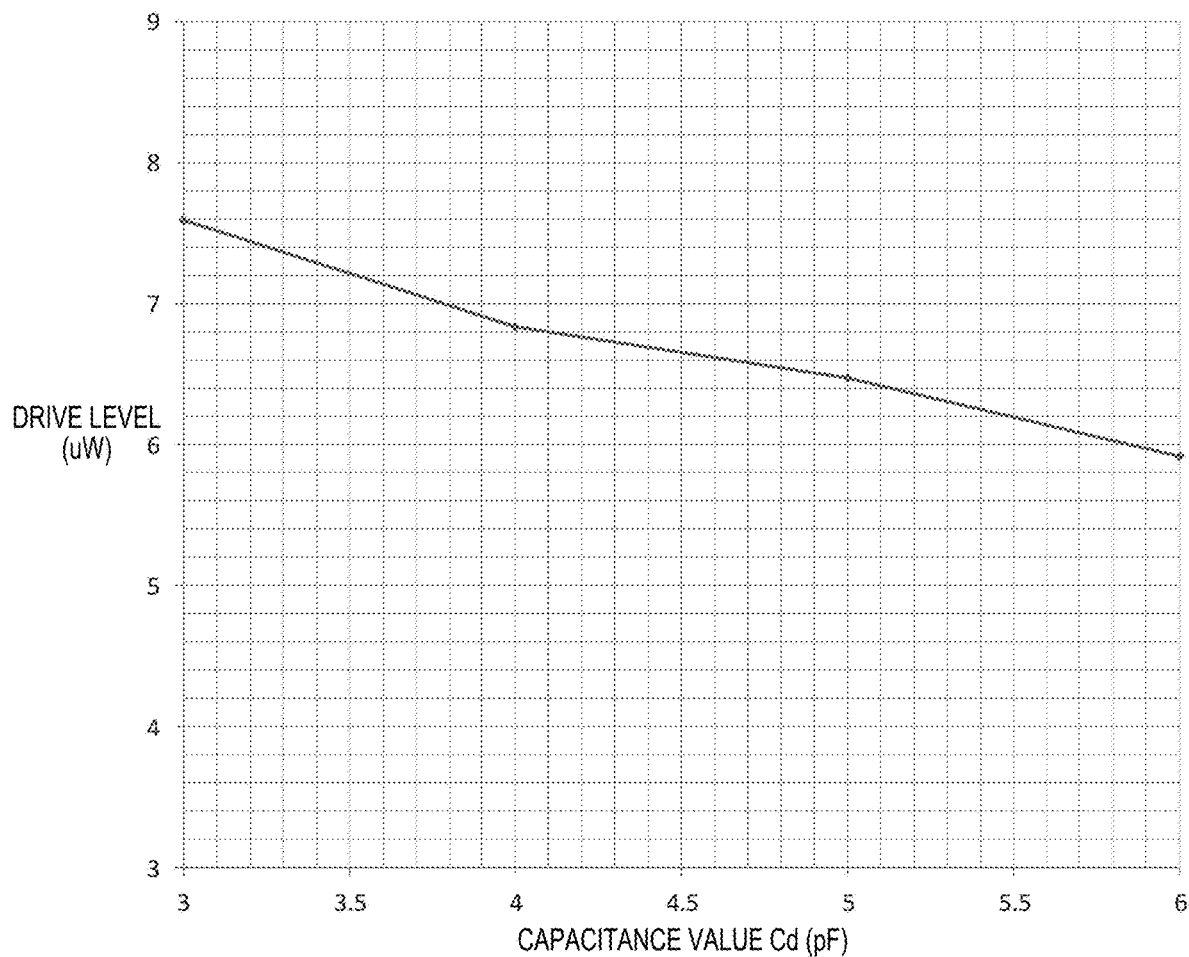
FIG. 13 is a graph illustrating an example of a relationship between a capacitance value of a second load capacitance and the drive level of the resonator in the oscillator according to the second embodiment.

Here, FIG. 12 is a graph illustrating an example of a relationship between the capacitance value Cg of the first load capacitance and the drive level of the resonator 3 in a case where the oscillation current $I_{OSC}$ is constant. FIG. 13 is a graph illustrating an example of a relationship between the capacitance value Cd of the second load capacitance and the drive level of the resonator 3 in a case where the oscillation current $I_{OSC}$ is constant. In FIGS. 12 and 13, a horizontal axis represents the capacitance value (pF), and a vertical axis represents the drive level (μW). As illustrated in FIGS. 12 and 13, it can be seen that the drive level of the resonator 3 is changed according to the capacitance value Cg of the first load capacitance and the capacitance value Cd of the second load capacitance. Specifically, as illustrated in FIG. 12, as the capacitance value Cg of the first load capacitance increases, the drive level of the resonator 3 increases. In addition, as illustrated in FIG. 13, as the capacitance value Cd of the second load capacitance increases, the drive level of the resonator 3 decreases. That is, in the second embodiment, the drive level of the resonator 3 is changed according to the load capacitance (the first load capacitance and the second load capacitance) which is variably set by the control signal (an example of "a second control signal") input from the external terminal of the oscillator 1. As apparent from a comparison of FIGS. 12 and 13 with FIG. 7, a variable range of the drive level of the resonator 3 by the setting of the load capacitance (the first load capacitance and the second load capacitance) is considerably narrower than a variable range of the drive level of the resonator 3 by the setting of the oscillation current $I_{OSC}$. Therefore, it is possible to finely adjust the drive level of the resonator 3 by the setting of the load capacitance (the first load capacitance and the second load capacitance).

In the second embodiment, in the DLD inspection mode, similar to the first embodiment, the control circuit 23 sets the oscillation current $I_{OSC}$ of the oscillation circuit 21 according to the value of the oscillation current setting data IOSC, further sets the first load capacitance and the second load capacitance according to the value of the first load capacitance selection data SELCG and the value of the second load capacitance selection data SELCD, and performs a control so as to operate the oscillation circuit 21 and the output circuit 22. That is, the drive level of the resonator 3 is variably set by the oscillation current setting data IOSC, and the drive level of the resonator 3 is finely adjusted by the first load capacitance selection data SELCG and the second load capacitance selection data SELCD.

In the second embodiment, in the DLD inspection of the resonator 3, for example, similarly to the first embodiment (FIG. 9), the setting of the oscillation current $I_{OSC}$ may be changed while the setting of the load capacitance (the first load capacitance and the second load capacitance) is fixed, or the setting of the oscillation current $I_{OSC}$ and the setting of the load capacitance (the first load capacitance and the second load capacitance) may be changed.

In the oscillator 1 according to the second embodiment described above, the drive level of the resonator 3 is changed according to the load capacitance of the resonator 3 that is variably set by the control signal input from the external terminals OE and OUT (the first load capacitance and the second load capacitance which are electrically connected to each of the gate terminal and the drain terminal of the NMOS transistor 211 included in the oscillation circuit 21). Specifically, as the first load capacitance of the resonator 3 is set to a larger value, the drive level of the resonator 3 increases. In contrast, as the second load capacitance of the resonator 3 is set to a larger value, the drive level of the resonator 3 decreases. Therefore, according to the oscillator 1 of the second embodiment, the drive level of the resonator 3 is finely adjusted, and thus it is possible to inspect the drive level dependency of the resonator 3 by measuring the frequency of the signal output from the external terminal OUT (signal of the drain terminal of the NMOS transistor 211).

In the second embodiment, only one of the first load capacitance and the second load capacitance may be variably set by the control signal input from the external terminal of the oscillator 1.

1-3. Third Embodiment

The oscillator 1 according to the third embodiment can also inspect whether or not a crystal impedance (CI) value of the resonator 3 is normal in the DLD inspection (hereinafter, referred to as "CI value inspection"). Hereinafter, in the oscillator 1 according to the third embodiment, the same description as in the first embodiment will be omitted or simplified, and contents different from those of the first embodiment will mainly be described. Since a structure and a functional block diagram of the oscillator 1 according to the third embodiment are the same as those of the oscillator 1 according to the first embodiment (FIGS. 1 to 4), the illustration and description thereof will be omitted. In addition, since the configuration of the oscillation circuit 21 of the oscillator 1 according to the third embodiment is similar to that of the oscillation circuit 21 (FIG. 6) of the oscillator 1 according to the first embodiment, the illustration thereof is omitted. Here, a setting range of the oscillation current setting data IOSC (a variable range of the oscillation current $I_{OSC}$) and an operation of the control circuit 23 in the DLD inspection mode are different from those in the first embodiment.

Figure 14:
FIG. 14 is a graph illustrating an example of a relationship between the oscillation current and a negative resistance of the oscillation circuit in the oscillator according to a third embodiment.

In the third embodiment, similar to the first embodiment, as a setting value of the n-bit oscillation current setting data IOSC increases, the oscillation current $I_{OSC}$ increases, and as the oscillation current $I_{OSC}$ increases, the drive level of the resonator 3 increases (refer to FIG. 7). As the oscillation current $I_{OSC}$ increases, a negative resistance of the oscillation circuit 21 increases. FIG. 14 is a graph illustrating an example of a relationship between the oscillation current $I_{OSC}$ (the current of the current source 25) and the negative resistance of the oscillation circuit 21. In FIG. 14, a horizontal axis represents the current (μA), and a vertical axis represents the negative resistance (Ω). As illustrated in FIG. 14, the negative resistance of the oscillation circuit 21 is changed according to the oscillation current $I_{OSC}$, and as the oscillation current $I_{OSC}$ increases (the setting value of the oscillation current setting data IOSC increases), the negative resistance of the oscillation circuit 21 increases.

Even in the third embodiment, as in the first embodiment, in the DLD inspection mode, the control circuit 23 sets the oscillation current $I_{OSC}$ of the oscillation circuit 21 according to the value of the oscillation current setting data IOSC, and performs a control so as to operate the oscillation circuit 21 and the output circuit 22. The drive level of the resonator 3 is variably set by the oscillation current setting data IOSC, and the negative resistance of the oscillation circuit 21 is also variably set. At this time, when a negative resistance value of the oscillation circuit 21 is larger than the CI value of the resonator 3, the resonator 3 oscillates, and an oscillation signal is output from the external terminal OUT of the oscillator 1 (OUT terminal of the oscillation IC 2). On the other hand, when the negative resistance value of the oscillation circuit 21 is smaller than the CI value of the resonator 3, the resonator 3 does not oscillate, and an oscillation signal is not output from the external terminal OUT of the oscillator 1 (OUT terminal of the oscillation IC 2).

In the present embodiment, in a case where the oscillation current setting data IOSC is set to 0 (the oscillation current $I_{OSC}$ is set to the minimum value), the resonator 3 does not oscillate, and in a case where the oscillation current setting data IOSC is set to a predetermined value K or more, the resonator 3 oscillates. Therefore, by monitoring whether or not the oscillation signal is output from the external terminal OUT of the oscillator 1 (OUT terminal of the oscillation IC 2) while changing the setting value of the oscillation current setting data IOSC from K to 0, the control circuit 23 can search the setting value of the oscillation current setting data IOSC that is a boundary between the oscillation start and the oscillation stop of the resonator 3. The control circuit 23 can perform the CI value inspection by estimating the CI value of the resonator 3 based on the setting value of the oscillation current setting data IOSC as the boundary (oscillation current $I_{OSC}$).

In the present embodiment, in the DLD inspection mode, the control circuit 23 initializes the setting value of the oscillation current setting data IOSC to K, increases the setting value of the oscillation current setting data IOSC (oscillation current $I_{OSC}$) step by step, and decreases the setting value of the oscillation current setting data IOSC to K step by step when the setting value becomes $2^n-1$ (the oscillation current $I_{OSC}$ becomes the maximum setting value). That is, in the DLD inspection mode, the control circuit 23 performs the DLD inspection of the resonator 3 in a case where the setting value of the oscillation current setting data IOSC is in a range from K to $2^{n-1}$. Further, from the oscillation start to the oscillation stop of the resonator 3, the control circuit 23 decreases the setting value of the oscillation current setting data IOSC (oscillation current $I_{OSC}$) from K step by step. That is, in the DLD inspection mode, the control circuit 23 performs the CI value inspection in a case where the setting value of the oscillation current setting data IOSC is in a range from K to 0.

Figure 15:
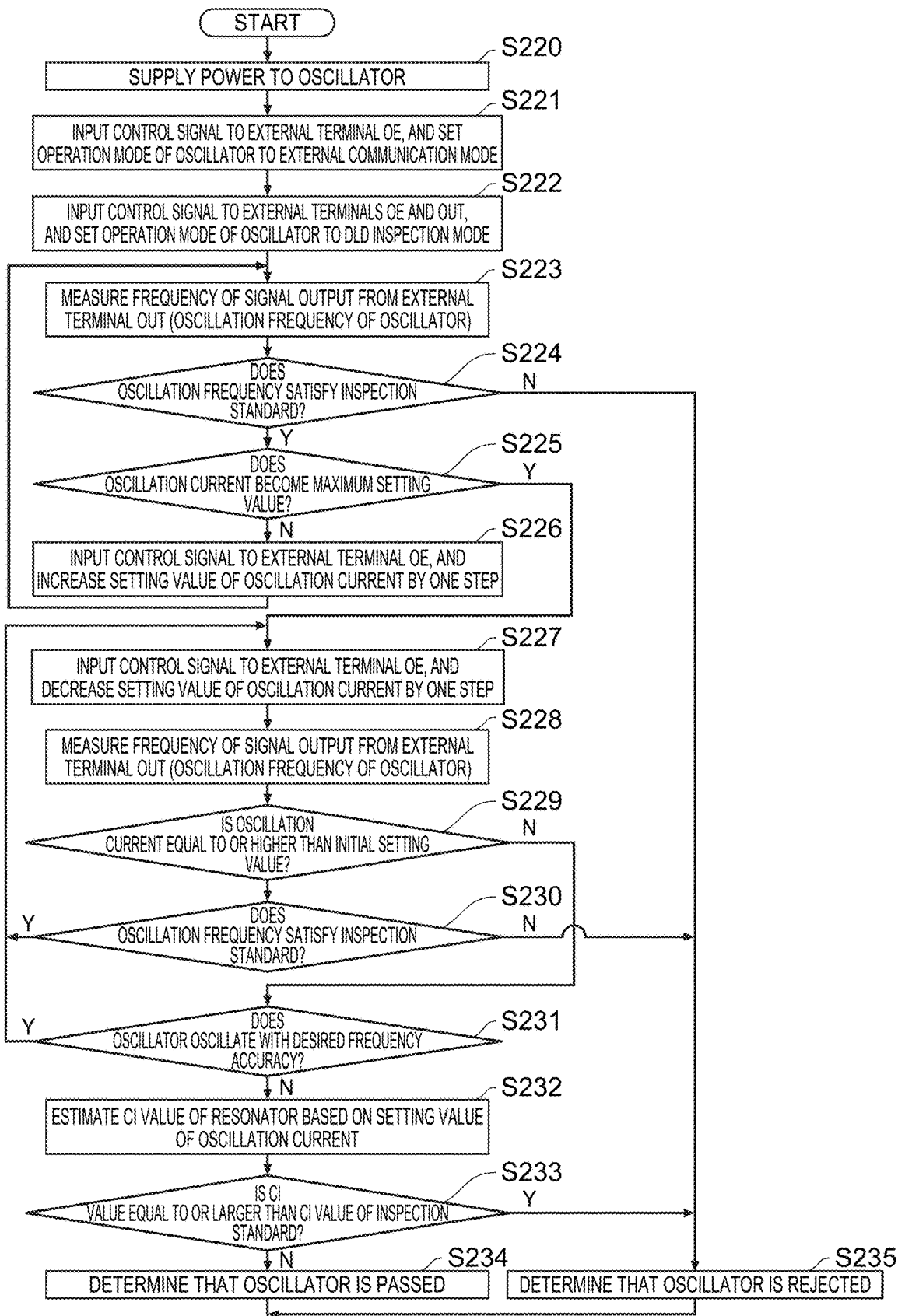
FIG. 15 is a flowchart illustrating an example of a detailed procedure of the DLD inspection of the resonator of the oscillator according to the second embodiment.

FIG. 15 is a flowchart according to the third embodiment illustrating an example of a detailed procedure of step S20 (DLD inspection of the resonator 3) illustrated in FIG. 8.

In the example of FIG. 15, first, the inspection device supplies power to the oscillator 1 (step S220), inputs the control signal to the external terminal OE, and sets the operation mode of the oscillator 1 to the external communication mode (step S221).

Next, the inspection device inputs the control signal to the external terminals OE and OUT, and sets the operation mode of the oscillator 1 to the DLD inspection mode (step S222). That is, in the external communication mode, the inspection device respectively inputs a serial clock signal and a serial data signal (DLD inspection command) to the external terminals OE and OUT of the oscillator 1, and sets the operation mode of the oscillator 1 to the DLD inspection mode. By step S222, the setting value of the oscillation current setting data IOSC is initialized to K.

Next, the inspection device measures the frequency of the signal output from the external terminal OUT (the oscillation frequency of the oscillator 1) (step S223).

Next, the inspection device determines whether or not the oscillation frequency measured in step S223 satisfies the inspection standard (step S224). In step S224, the inspection device determines whether or not a frequency deviation of the oscillation frequency measured in step S223 is included in a desired range in consideration of manufacturing variations of the resonator 3 (for example, a range of a design value ±1 ppm) based on the oscillation frequency when the value of the oscillation current setting data IOSC is K (initial value).

In a case where the oscillation frequency does not satisfy the inspection standard (N in step S224), the inspection device determines that the oscillator 1 is rejected in the inspection (step S235). In addition, in a case where the oscillation frequency satisfies the inspection standard (Y in step S224), when the oscillation current $I_{OSC}$ does not become the maximum setting value (when the oscillation current setting data IOSC is not set to the maximum value $2^n-1$) (N in step S225), the inspection device inputs the control signal to the external terminal OE, and increases the setting value of the oscillation current $I_{OSC}$ by one step (step S226). That is, in the DLD inspection mode, the inspection device inputs a pulse to the external terminal OE of the oscillator 1, and increases the value of the oscillation current setting data IOSC from K (initial value) to K+1.

Then, the inspection device repeatedly performs steps S223 to S226 until the oscillation current $I_{OSC}$ becomes the maximum setting value (N in step S225). That is, the inspection device inputs a pulse to the external terminal OE of the oscillator 1, measures the oscillation frequency each time the value of the oscillation current setting data IOSC increases from K+1 to $2^n-1$ step by step, and determines whether or not the oscillation frequency satisfies the inspection standard.

Next, when the oscillation current $I_{OSC}$ becomes the maximum setting value (the oscillation current setting data IOSC becomes the maximum value $2^n-1$) (Y in step S225), the inspection device inputs the control signal to the external terminal OE, and decreases the setting value of the oscillation current $I_{OSC}$ by one step (step S227). That is, in the DLD inspection mode, the inspection device inputs a pulse to the external terminal OE of the oscillator 1, and decreases the value of the oscillation current setting data IOSC from $2^n-1$ (maximum value) to $2^n-2$.

Next, the inspection device measures the frequency of the signal output from the external terminal OUT (the oscillation frequency of the oscillator 1) (step S228).

Next, when the oscillation current $I_{OSC}$ is equal to or higher than the initial setting value (the setting value of the oscillation current setting data IOSC is K or more) (Y in step S229), the inspection device determines whether or not the oscillation frequency measured in step S228 satisfies the inspection standard (step S230). In step S230, the inspection device determines whether or not a frequency deviation of the oscillation frequency measured in step S228 is included in a desired range in consideration of manufacturing variations of the resonator 3 (for example, a range of a design value ±1 ppm) based on the oscillation frequency when the value of the oscillation current setting data IOSC is K (initial value). In addition, the inspection device determines whether or not a difference (absolute value) between the oscillation frequency measured in step S228 and the oscillation frequency measured in step S223 at the same setting value of the oscillation current $I_{OSC}$, that is, a hysteresis is within a desired range (for example, a range of 0.5 ppm).

In a case where the oscillation frequency does not satisfy the inspection standard (N in step S230), the inspection device determines that the oscillator 1 is rejected in the inspection (step S235). In addition, in a case where the oscillation frequency satisfies the inspection standard (Y in step S230), the inspection device repeatedly performs steps S227 to S229 until the oscillation current $I_{OSC}$ becomes the initial setting value (the setting value of the oscillation current setting data IOSC becomes less than the initial value K) (Y in step S229). That is, the inspection device inputs a pulse to the external terminal OE of the oscillator 1, measures the oscillation frequency each time the value of the oscillation current setting data IOSC decreases from $2^n-2$ to K step by step, and determines whether or not the oscillation frequency satisfies the inspection standard.

Next, when the oscillation current $I_{OSC}$ is less than the initial setting value (the setting value of the oscillation current setting data IOSC is less than the initial value K) (N in step S229), the inspection device determines whether or not the oscillator 1 oscillates with desired frequency accuracy based on the oscillation frequency measured in step S228 (step S231). In a case where the oscillator 1 oscillates with desired frequency accuracy (Y in step S231), the inspection device performs again steps S227 to S229. That is, the inspection device inputs a pulse to the external terminal OE of the oscillator 1, and determines whether or not the oscillator 1 oscillates with desired frequency accuracy each time the value of the oscillation current setting data IOSC decreases from K−1 step by step.

In a case where the oscillator 1 does not oscillate with the desired frequency accuracy (N in step S231), the inspection device estimates the CI value of the resonator 3 based on the setting value of the oscillation current $I_{OSC}$ (the setting value of the oscillation current setting data IOSC) (step S232). For example, the inspection device may estimate the CI value of the resonator 3 based on the negative resistance value of the oscillation circuit 21 with respect to the setting value of the oscillation current $I_{OSC}$ that is obtained from the relationship of FIG. 14. For example, the CI value of the resonator 3 may be estimated as a value which matches with the negative resistance value.

For the relationship between the oscillation current $I_{OSC}$ and the negative resistance of the oscillation circuit 21, which is illustrated in FIG. 14, the relationship may be once calculated by obtaining relationships for a plurality of prototypes of the oscillator 1 at a stage of design evaluation and averaging the relationships, and it is not necessary to calculate the relationship for each oscillator 1 in the process of manufacturing the oscillator 1.

Finally, in a case where the CI value of the resonator 3 estimated in step S232 is smaller than the CI value of the inspection standard (N in step S233), the inspection device determines that the oscillator 1 is passed in the inspection, and in a case where the CI value of the resonator 3 estimated in step S232 is equal to or larger than the CI value of the inspection standard (Y in step S233), the inspection device determines that the oscillator 1 is rejected in the inspection (step S235).

In the oscillator 1 according to the third embodiment described above, the negative resistance value of the oscillation circuit 21 is changed according to the oscillation current $I_{OSC}$ which is variably set by the control signal input from the external terminals OE and OUT (current flowing through the drain terminal of the NMOS transistor 211 included in the oscillation circuit 21), and in a case where the impedance value (CI value) of the resonator 3 is larger than the negative resistance value, the oscillation of the resonator 3 is stopped. Specifically, as the oscillation current $I_{OSC}$ is set to a larger value, the degree of oscillation margin increases and the oscillation of the resonator 3 is more likely to be stabilized. In contrast, as the oscillation current $I_{OSC}$ is set to a smaller value, the degree of oscillation margin decreases and the oscillation of the resonator 3 is likely to be stopped. Therefore, according to the oscillator 1 of the third embodiment, it is possible to inspect the CI value of the resonator 3 by observing the signal output from the external terminal OUT of the oscillator 1 (signal of the drain terminal of the NMOS transistor 211).

In addition, according to the oscillator 1 of the third embodiment, in the DLD inspection mode, it is possible to perform the drive level dependency inspection of the resonator 3 and the CI value inspection of the resonator 3, and thus an inspection time can be shortened.

1-4. Modification Example

For example, in the oscillator 1 according to the second embodiment, as in the third embodiment, the control circuit 23 may perform the DLD inspection and the CI value inspection in the DLD inspection mode.

In addition, in the oscillator 1 according to each of the embodiments, the value of the oscillation current $I_{OSC}$ is, for example, discretely (digitally) changed according to the value of the oscillation current setting data IOSC. On the other hand, the value of the oscillation current $I_{OSC}$ may be changed, for example, continuously (analogically). For example, the oscillator 1 may be configured such that the value of the oscillation current $I_{OSC}$ is continuously (analogically) changed according to an analog signal input from the external terminal.

Figure 16:
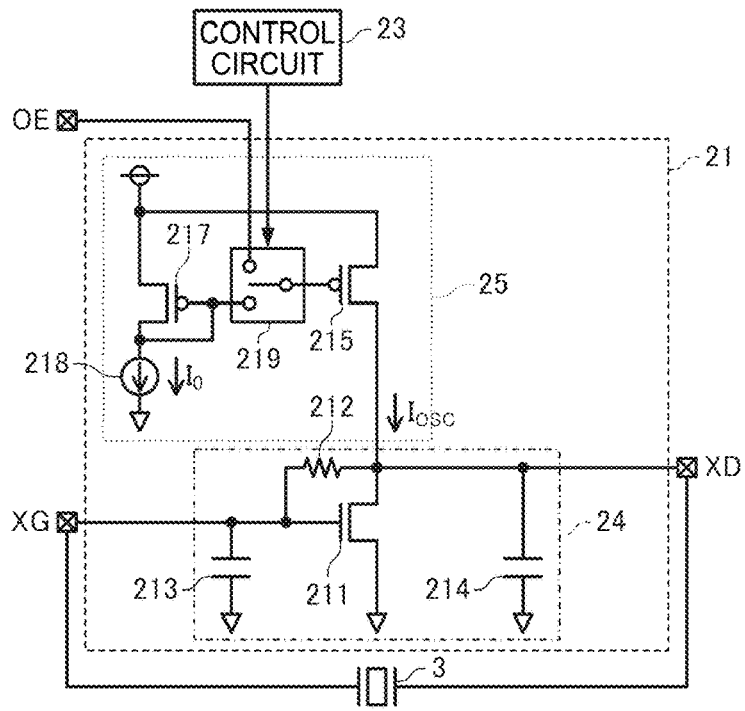
FIG. 16 is a diagram illustrating a configuration example of the oscillation circuit of the oscillator according to a modification example.

FIG. 16 is a diagram illustrating a configuration example of the oscillation circuit 21 of the oscillator 1 according to a modification example. In FIG. 16, the same reference numerals are given to the same components as those illustrated in FIG. 6. In the example of FIG. 16, the configuration of the amplification circuit 24 is the same as the configuration of the amplification circuit 24 illustrated in FIG. 6, and the configuration of the current source 25 is different from the configuration of the current source 25 illustrated in FIG. 6.

In the example of FIG. 16, in the normal operation mode, the control circuit 23 controls a switch circuit 219 such that the gate terminal of the PMOS transistor 215 is electrically connected to the gate terminal of the PMOS transistor 217. Accordingly, a current mirror circuit is configured with the PMOS transistor 215, the switch circuit 219, the PMOS transistor 217, and the constant current source 218. Accordingly, assuming that the size ratio between the PMOS transistor 215 and the PMOS transistor 217 is $N_X$, the oscillation current $I_{OSC}$, which is $N_X$ times the current $I_0$ flowing through the PMOS transistor 217 (current flowing through the constant current source 218), flows. The oscillation current $I_{OSC}$ is set to be sufficiently large, and thus the negative resistance value of the oscillation circuit becomes sufficiently larger than the CI value of the resonator 3. Therefore, the resonator 3 can oscillate at a desired frequency.

On the other hand, in the DLD inspection mode, the control circuit 23 controls the switch circuit 219 such that the gate terminal of the PMOS transistor 215 is electrically connected to the external terminal OE of the oscillator 1 (OE terminal of the oscillation IC 2). Thus, a voltage can be applied from the external terminal OE of the oscillator 1 to the gate terminal of the PMOS transistor 215. The value of the oscillation current $I_{OSC}$ is changed according to the voltage applied to the gate terminal of the PMOS transistor 215. Therefore, a desired voltage is subsequently applied to the external terminal OE of the oscillator 1, and thus it is possible to perform the DLD inspection.

Further, although the oscillator 1 according to each of the embodiments is a simple oscillator (simple packaged crystal oscillator (SPXO) or the like), which does not perform temperature compensation or temperature control, for example, an oscillator having a temperature compensation function (temperature compensated crystal oscillator (TCXO) or the like), an oscillator having a temperature control function (oven controlled crystal oscillator (OCXO) or the like), or an oscillator having a frequency control function (voltage controlled crystal oscillator (VCXO) or the like) may be used.

2. Electronic Apparatus

Figure 17:
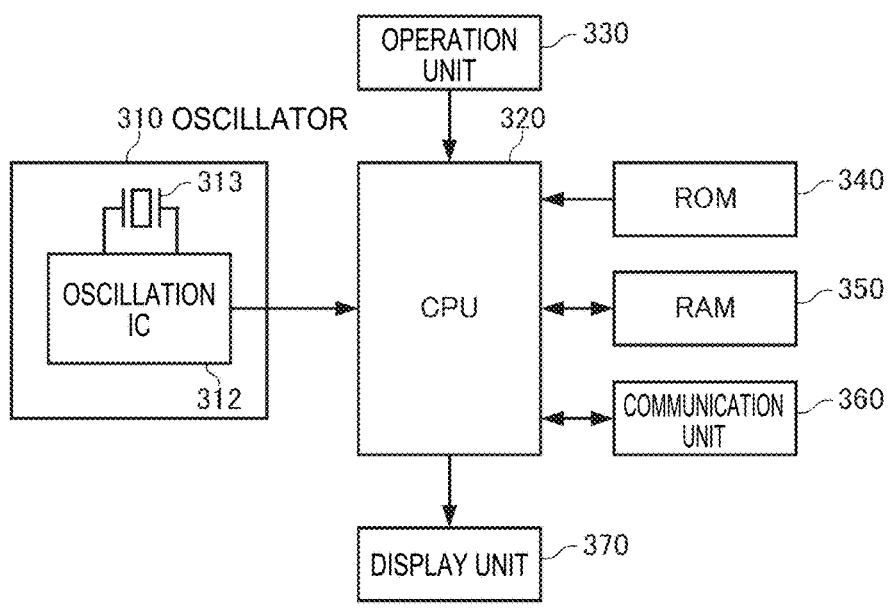
FIG. 17 is a functional block diagram of an electronic apparatus according to the present embodiment.
Figure 18:
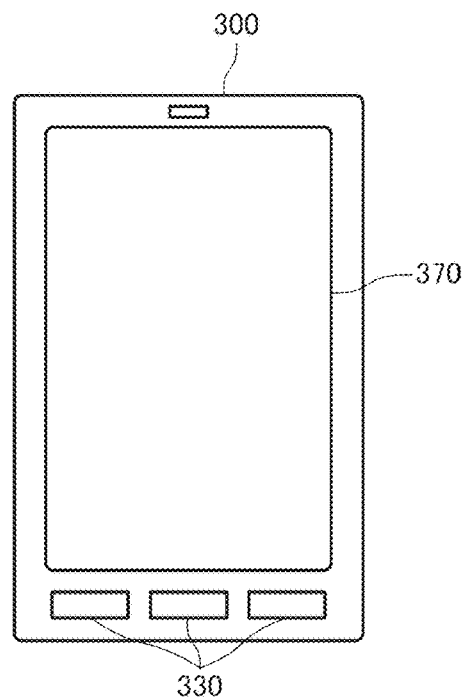
FIG. 18 is a view illustrating an example of an external appearance of the electronic apparatus according to the present embodiment.

FIG. 17 is a functional block diagram illustrating an example of a configuration of an electronic apparatus according to the present embodiment. FIG. 18 is a diagram illustrating an example of an external appearance of a smartphone which is an example of the electronic apparatus according to the present embodiment.

The electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. The electronic apparatus according to the present embodiment may have a configuration in which a part of the components (units) illustrated in FIG. 17 is omitted or changed, or in which another component is added.

The oscillator 310 includes an oscillation IC 312 and a resonator 313. The oscillation IC 312 generates an oscillation signal by oscillating the resonator 313. The oscillation signal is output from the external terminal of the oscillator 310 to the CPU 320.

The CPU 320 is a processing unit that performs various calculation processing and control processing using the oscillation signal, which is input from the oscillator 310 as a clock signal, according to a program stored in the ROM 340 or the like. Specifically, the CPU 320 performs various processing according to an operation signal from the operation unit 330, processing of controlling the communication unit 360 to perform data communication with an external apparatus, processing of transmitting a display signal for displaying various kinds of information on the display unit 370, and the like.

The operation unit 330 is an input device which is configured with operation keys, button switches, and the like, and outputs an operation signal according to an operation by a user to the CPU 320.

The ROM 340 is a storage unit that stores programs, data, and the like required for performing various calculation processing and control processing by the CPU 320.

The RAM 350 is used as a work area of the CPU 320, and is a storage unit that temporarily stores programs and data which are read from the ROM 340, data which is input from the operation unit 330, calculation results which are obtained by execution of various programs by the CPU 320, and the like.

The communication unit 360 performs various controls for establishing data communication between the CPU 320 and the external apparatus.

The display unit 370 is a display device configured with a liquid crystal display (LCD) and the like, and displays various kinds of information based on a display signal input from the CPU 320. The display unit 370 may be provided with a touch panel which functions as the operation unit 330.

The oscillator 1 according to each embodiment described above is applied as the oscillator 310, or the oscillation IC 2 according to each embodiment described above is applied as the oscillation IC 312, and thus it is possible to realize downsizing of the oscillator 310 and a reduction of a risk of breakdown due to static electricity and to inspect the drive level dependency of the resonator 313. Therefore, it is possible to realize the electronic apparatus with high reliability while reducing a cost.

As the electronic apparatus 300, various electronic apparatuses are considered, and examples of the electronic apparatuses include a personal computer (for example, a mobile-type personal computer, a laptop personal computer, or a tablet personal computer), a mobile terminal such as a smartphone or a mobile phone, a digital still camera, an ink jet ejecting apparatus (for example, an ink jet printer), a storage area network apparatus such as a router or a switch, a local area network apparatus, an apparatus for a base station of a mobile terminal, a television, a video camera, a video recorder, a car navigation apparatus, a real-time clock apparatus, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, an electronic thermometer, a sphygmomanometer, a blood sugar meter, an electrocardiogram measurement apparatus, an ultrasound diagnostic apparatus, and an electronic endoscope), a fish detector, various measurement apparatuses, meters and gauges (for example, meters and gauges of a vehicle, an aircraft, and a vessel), a flight simulator, a head-mounted display, a motion tracer, a motion tracker, a motion controller, a pedestrian dead reckoning (PDR) apparatus, and the like.

An example of the electronic apparatus 300 according to the present embodiment includes a transmission apparatus, which functions as, for example, an apparatus for a base station of a terminal that performs communication with a terminal in a wired or wireless manner using the oscillator 310 as a reference signal source. For example, the oscillator 1 according to each embodiment described above is applied as the oscillator 310, and thus it is possible to realize the electronic apparatus 300, which can be used in, for example, a communication base station and is desired to have high frequency accuracy, high performance, and high reliability, at a lower cost compared to the case of the related art.

Further, as another example of the electronic apparatus 300 according to the present embodiment, a communication apparatus in which the communication unit 360 receives an external clock signal and the CPU 320 (processing unit) includes a frequency control unit that controls the frequency of the oscillator 310 based on the external clock signal and the output signal of the oscillator 310 (internal clock signal), may be used. The communication apparatus may be, for example, a basic system network apparatus such as a stratum 3, or a communication equipment used for a femtocell.

3. Vehicle

Figure 19:
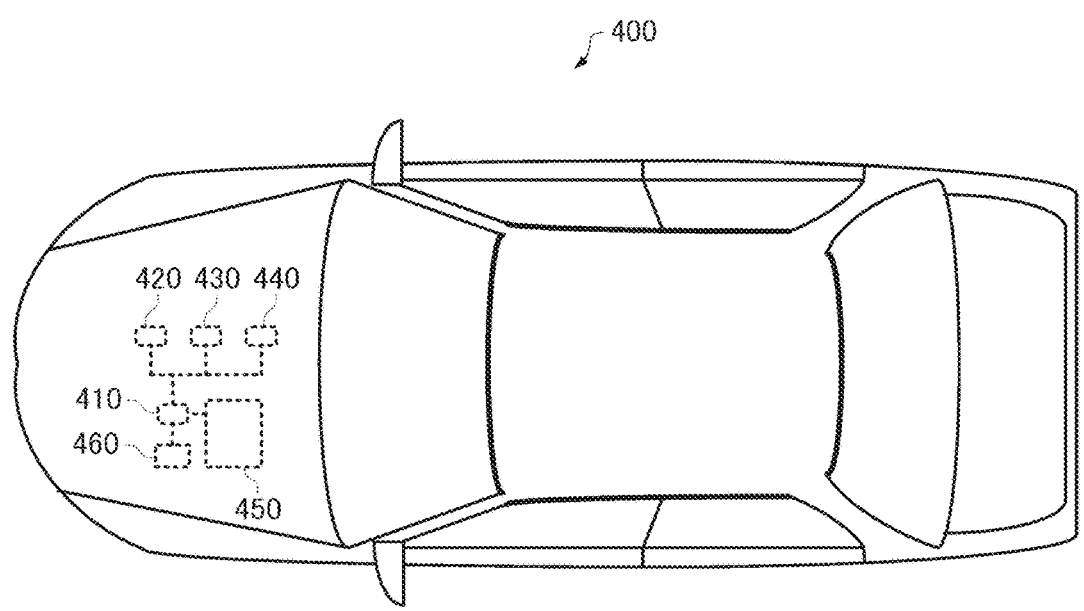
FIG. 19 is a view illustrating an example of a vehicle according to the present embodiment.

FIG. 19 is a view (top view) illustrating an example of a vehicle according to the present embodiment. The vehicle 400 illustrated in FIG. 19 includes an oscillator 410, controllers 420, 430, and 440 that perform various controls for an engine system, a brake system, a keyless entry system, and the like, a battery 450, and a backup battery 460. The vehicle according to the present embodiment may have a configuration in which a part of the components (units) illustrated in FIG. 19 is omitted, or in which another component is added.

The oscillator 410 includes an oscillation IC and a resonator which are not illustrated, and the oscillation IC generates an oscillation signal by oscillating the resonator. The oscillation signal is output from the external terminal of the oscillator 410 to the controllers 420, 430, and 440, and is used as, for example, a clock signal.

The battery 450 supplies the power to the oscillator 410 and the controllers 420, 430, and 440. The backup battery 460 supplies the power to the oscillator 410 and the controllers 420, 430, and 440 when the output voltage of the battery 450 is lower than a threshold.

The oscillator 1 according to each embodiment described above is applied as the oscillator 410, or the oscillation IC 2 according to each embodiment described above is applied as the oscillation IC included in the oscillator 410, and thus it is possible to realize downsizing of the oscillator 410 and a reduction of a risk of breakdown due to static electricity and to inspect the drive level dependency of the resonator included in the oscillator 410. Therefore, it is possible to realize the vehicle with high reliability while reducing a cost.

As the vehicle 400, various vehicles are considered, and examples of the vehicles include, for example, an automobile (including an electric car), an aircraft such as a jet plane or a helicopter, a vessel, a rocket, a satellite, and the like.

The invention is not limited to the present embodiment, and various modifications can be made without departing from the scope of the invention.

Each of the embodiments and the modification example is an example, and the invention is not limited thereto. For example, each of the embodiments and the modification example can also be appropriately combined with each other.

The invention includes configurations which are substantially the same as the configurations described in the embodiments (for example, configurations having the same functions, same methods and same results, or the same objects and same effects). In addition, the invention includes configurations in which non-essential elements of the configurations described in the embodiments are replaced. In addition, the invention includes configurations exhibiting the same operations and effects or configurations capable of achieving the same objects, as those of the configurations described in the embodiments. In addition, the invention includes configurations in which known techniques are added to the configurations described in the embodiments.

The entire disclosure of Japanese Patent Application No. 2017-036454, filed Feb. 28, 2017 is expressly incorporated by reference herein.

What is claimed is:

1. An oscillator comprising:
an external terminal;
a resonator; and
an oscillation circuit that oscillates the resonator, wherein:
the oscillation circuit includes an amplification circuit and a current source which supplies a current to the amplification circuit,
the current is configured, after the oscillator has been turned on, to be set according to a first control signal which is input from the external terminal and a drive level of the resonator is configured to be changed according to the setting of the current,
the current source includes a constant current source and a current mirror circuit and is controlled by current select data to generate various current values,
the current mirror circuit includes a first transistor that is connected to the constant current source,
the current source includes two or more transistors that are each connected to a switch to be selectively turned on or off based on the current select data, and
according to the first control signal input from the external terminal, the switch for each of the two or more transistors in the current source sequentially enters into an ON state, and after reaching a maximum value of the current supplied to the amplification circuit, the switch sequentially enters into an OFF state.

2. The oscillator according to claim 1,
wherein the amplification circuit includes an NMOS transistor and a resistor of which one end is electrically connected to a gate terminal of the NMOS transistor and the other end is electrically connected to a drain terminal of the NMOS transistor, and
wherein the current source supplies the current to the drain terminal of the NMOS transistor.

3. The oscillator according to claim 1,
wherein a load capacitance of the resonator is variably set by a second control signal which is input from the external terminal, and the drive level is changed according to the load capacitance.

4. The oscillator according to claim 2,
wherein a load capacitance of the resonator is variably set by a second control signal which is input from the external terminal, and the drive level is changed according to the load capacitance.

5. The oscillator according to claim 1,
wherein the amplification circuit includes an NMOS transistor,
wherein the oscillation circuit includes a first load capacitance which is electrically connected to a gate terminal of the NMOS transistor and a second load capacitance which is electrically connected to a drain terminal of the NMOS transistor, and
wherein at least one of the first load capacitance and the second load capacitance is variably set according to a second control signal which is input from the external terminal, and the drive level is changed according to the first load capacitance and the second load capacitance.

6. The oscillator according to claim 5,
wherein the drive level increases as the first load capacitance increases, and
wherein the drive level decreases as the second load capacitance increases.

7. The oscillator according to claim 1,
wherein the first control signal includes at least one pulse, and
wherein the setting of the current is switched each time the pulse is input to the external terminal.

8. The oscillator according to claim 2,
wherein the first control signal includes at least one pulse, and
wherein the setting of the current is switched each time the pulse is input to the external terminal.

9. The oscillator according to claim 3,
wherein the first control signal includes at least one pulse, and
wherein the setting of the current is switched each time the pulse is input to the external terminal.

10. The oscillator according to claim 5,
wherein the first control signal includes at least one pulse, and
wherein the setting of the current is switched each time the pulse is input to the external terminal.

11. The oscillator according to claim 1,
wherein a negative resistance value of the oscillation circuit is changed according to the current.

12. The oscillator according to claim 2,
wherein a negative resistance value of the oscillation circuit is changed according to the current.

13. The oscillator according to claim 3,
wherein a negative resistance value of the oscillation circuit is changed according to the current.

14. The oscillator according to claim 5,
wherein a negative resistance value of the oscillation circuit is changed according to the current.

15. The oscillator according to claim 7,
wherein a negative resistance value of the oscillation circuit is changed according to the current.

16. The oscillator according to claim 1,
wherein the oscillator does not include an external terminal which is electrically connected to a wiring connecting the resonator and the oscillation circuit and is used only for an inspection of the resonator.

17. An electronic apparatus comprising:
the oscillator according to claim 1.

18. A vehicle comprising:
the oscillator according to claim 1.

19. A manufacturing method of an oscillator, the method comprising:
assembling an oscillator, the oscillator including an external terminal, a resonator, and an oscillation circuit that oscillates the resonator, in which the oscillation circuit includes an amplification circuit and a current source which supplies a current to the amplification circuit, in which the current is configured, after the oscillator has been turned on, to be set according to a first control signal which is input from the external terminal and a drive level of the resonator is changed according to the current; and inputting the first control signal to the external terminal and inspecting a drive level dependency of the resonator based on a change of a signal output from the oscillator, wherein the current source includes a constant current source and a current mirror circuit and is controlled by current select data to generate various current values, wherein:

the current mirror circuit includes a first transistor that is connected to the constant current source, the current source includes two or more transistors that are each connected to a switch to be selectively turned on or off based on the current select data, and according to the first control signal input from the external terminal, the switch for each of the two or more transistors in the current source sequentially enters into an ON state, and after reaching a maximum value of the current supplied to the amplification circuit, the switch sequentially enters into an OFF state.

20. The manufacturing method according to claim 19, wherein a negative resistance value of the oscillation circuit of the oscillator is changed according to the current, and wherein the inspecting of the drive level dependency of the resonator further includes inspecting of an impedance value of the resonator based on the signal output from the oscillator.

* * * * *